United States Patent
Harada et al.

(10) Patent No.: US 12,187,916 B2
(45) Date of Patent: Jan. 7, 2025

(54) CURABLE COMPOSITION, FILM, LAMINATED BODY, AND DISPLAY APPARATUS

(71) Applicant: SUMITOMO CHEMICAL COMPANY, LIMITED, Tokyo (JP)

(72) Inventors: Yoshihiro Harada, Osaka (JP); Yoshifumi Komatsu, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 613 days.

(21) Appl. No.: 17/282,700

(22) PCT Filed: Oct. 23, 2019

(86) PCT No.: PCT/JP2019/041450
§ 371 (c)(1),
(2) Date: Apr. 2, 2021

(87) PCT Pub. No.: WO2020/090567
PCT Pub. Date: May 7, 2020

(65) Prior Publication Data
US 2021/0380820 A1    Dec. 9, 2021

(30) Foreign Application Priority Data

Oct. 31, 2018 (JP) .................. 2018-205893

(51) Int. Cl.
| | | |
|---|---|---|
| C09D 5/22 | (2006.01) | |
| B32B 27/20 | (2006.01) | |
| C09D 4/00 | (2006.01) | |
| C09D 7/45 | (2018.01) | |
| C09D 135/02 | (2006.01) | |
| C09K 11/02 | (2006.01) | |
| C09K 11/66 | (2006.01) | |
| G02F 1/13357 | (2006.01) | |
| H01G 9/20 | (2006.01) | |
| H01L 33/50 | (2010.01) | |

(52) U.S. Cl.
CPC ............ *C09D 5/22* (2013.01); *B32B 27/20* (2013.01); *C09D 4/00* (2013.01); *C09D 7/45* (2018.01); *C09D 135/02* (2013.01); *C09K 11/02* (2013.01); *C09K 11/664* (2013.01); *C09K 11/665* (2013.01); *B32B 2307/422* (2013.01); *B32B 2457/206* (2013.01); *G02F 1/133617* (2013.01); *H01G 9/2059* (2013.01); *H01L 33/502* (2013.01)

(58) Field of Classification Search
CPC ..... C09K 11/664; C09K 11/665; C09K 11/02; H01L 33/502; G02F 1/133617; C09D 5/22
See application file for complete search history.

(56) References Cited

U.S. PATENT DOCUMENTS

| | | |
|---|---|---|
| 2017/0121598 A1 | 5/2017 | Min et al. |
| 2017/0186922 A1 | 6/2017 | Kim et al. |
| 2017/0322436 A1 | 11/2017 | Yamada et al. |
| 2017/0369776 A1 | 12/2017 | Luchinger et al. |
| 2018/0208840 A1* | 7/2018 | Lüchinger ............. C09D 11/50 |
| 2018/0355244 A1* | 12/2018 | Lüchinger ............. B82Y 30/00 |
| 2019/0153313 A1 | 5/2019 | Lüchinger et al. |
| 2020/0168666 A1* | 5/2020 | Naito ................ C09K 11/665 |
| 2020/0239713 A1 | 7/2020 | Kanesaka et al. |
| 2021/0122976 A1* | 4/2021 | Naito ................ C09K 11/70 |

FOREIGN PATENT DOCUMENTS

| | | |
|---|---|---|
| CN | 106009930 | * 10/2016 |
| EP | 3 168 278 A1 | 5/2017 |
| EP | 3 184 602 A1 | 6/2017 |
| JP | 2006-111725 A | 4/2006 |
| JP | 2007-99571 A | 4/2007 |
| JP | 2010-248505 A | 11/2010 |
| JP | 2013-37059 A | 2/2013 |
| JP | 2015-149121 A | 8/2015 |
| JP | 2017-21322 A | 1/2017 |

(Continued)

OTHER PUBLICATIONS

Chinese Office Action for Chinese Application No. 201980071200.7, dated Jan. 11, 2023, with an English translation.
Taiwanese Office Action and Search Report (including an English Translation thereof) issued in the corresponding Taiwanese Patent Application No. 108138966 on Apr. 12, 2023.
International Search Report for PCT/JP2019/041450 (PCT/ISA/210) mailed on Jan. 7, 2020.
Chinese Office Action and Search Report for corresponding Chinese Application No. 201980071200.7, dated Sep. 20, 2022, with English translation.
Extended European Search Report for European Application No. 19880326.4, dated Jul. 18, 2022.

(Continued)

*Primary Examiner* — C Melissa Koslow
(74) *Attorney, Agent, or Firm* — Birch, Stewart, Kolasch & Birch, LLP

(57) ABSTRACT

An object of the present invention is to provide a curable composition comprising a fluorescent particle containing a perovskite compound and a photopolymerizable compound, with a good dispersibility of the above semiconductor particle to the above photopolymerizable compound; a film formed by curing the curable composition; and a laminated body and a display apparatus comprising the film. Provided are a curable composition comprising a fluorescent particle (A) containing a perovskite compound, a photopolymerizable compound (B), and a dispersing agent (C), wherein the dispersing agent (C) includes at least one kind of compound selected from the group consisting of phosphoric acid compounds, carboxylic acid compounds, sulfonic acid compounds, primary to tertiary amine compounds, quaternary ammonium compounds, and thiol compounds; a film formed by curing the curable composition; and a laminated body and a display apparatus comprising the film.

8 Claims, 1 Drawing Sheet

(56) References Cited

FOREIGN PATENT DOCUMENTS

| | | | |
|---|---|---|---|
| JP | 2017-119735 A | | 7/2017 |
| JP | 2018-506625 A | | 3/2018 |
| JP | 2018-529793 A | | 10/2018 |
| JP | 2018-530633 A | | 10/2018 |
| JP | 2018-193467 A | | 12/2018 |
| WO | WO 2016/125502 A1 | | 8/2016 |
| WO | WO 2018/028870 A1 | | 2/2018 |
| WO | WO 2018/168638 | * | 9/2018 |
| WO | WO 2018/168638 A1 | | 9/2018 |
| WO | WO 2018/212260 | * | 11/2018 |
| WO | WO 2019/022195 A1 | | 1/2019 |

OTHER PUBLICATIONS

Japanese Office Action for Japanese Application No. 2019-197318, dated Feb. 7, 2023, with an English translation.
Japanese Notice of Reasons for Refusal for Japanese Application No. 2019-197318, dated May 23, 2023, with an English translation.
Japanese Third Party Opinion to JP2020-070444A (Japanese Application No. 2019-197318), dated May 23, 2023.
"Concentration quenching," Encyclopedic dictionary of chemistry 6 Reduced edition, Kyoritsu Shuppan Co., Ltd., 2006, p. 920 (3 pages total).
Japanese Third Party Opinion for Japanese Application No. 2019-197318, dated Sep. 11, 2023, with English translation.
Kobayashi et al., "Particle surface and dispersion techniques," Nikkan Kogyo Shimbun, Ltd., 2018, pp. 143-146.
Murase, "Development of quantum dot dispersed glass phosphor," Journal of Applied Physics, 2011, vol. 80, Issue 4, pp. 325-328.
Uematsu et al., "Studies on Energy Transfer of Semiconductor Nanoparticles Aiming at Device Fabrications," The Murata Science Foundation, 2017, pp. 95-97, with an English translation.
Korean Office Action for Korean Application No. 10-2021-7013059, dated Dec. 18, 2023, with an English translation.

* cited by examiner

[Figure 1]
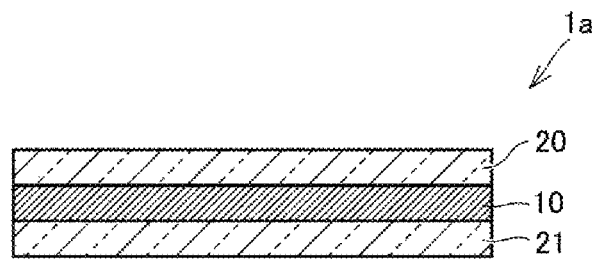
[Figure 2]
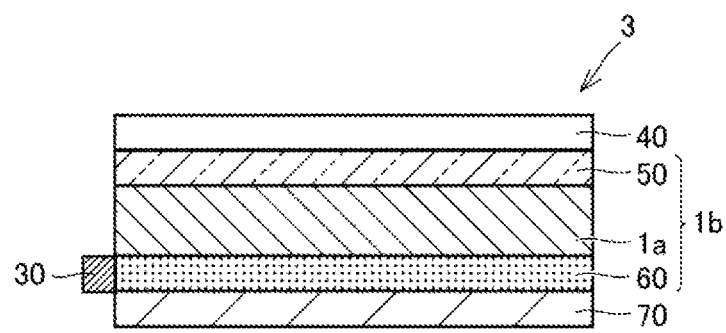

CURABLE COMPOSITION, FILM, LAMINATED BODY, AND DISPLAY APPARATUS

TECHNICAL FIELD

The present invention relates to a curable composition, a film formed by curing the curable composition, and a laminated body and a display apparatus comprising the film.

BACKGROUND ART

In recent years, there has been a growing interest in perovskite compounds having a high quantum yield as a wavelength conversion material. For example, Patent Literature 1 discloses a light emitting component that comprises a light emitting crystal having a perovskite structure.

CITATION LIST

Patent Literature

Patent Literature 1: Japanese Translation of PCT International Application Publication No. 2018-506625

SUMMARY OF INVENTION

Technical Problem

An object of the present invention is to provide a curable composition comprising a fluorescent particle containing a perovskite compound and a photopolymerizable compound, with a good dispersibility of the above fluorescent particle to the above photopolymerizable compound; a film formed by curing the curable composition; and a laminated body and a display apparatus comprising the film.

Solution to Problem

The present invention provides the following curable composition, film, laminated body, and display apparatus.

[1] A curable composition comprising a fluorescent particle (A) containing a perovskite compound, a photopolymerizable compound (B), and a dispersing agent (C),
wherein the dispersing agent (C) includes at least one kind of compound selected from the group consisting of phosphoric acid compounds, carboxylic acid compounds, sulfonic acid compounds, primary to tertiary amine compounds, quaternary ammonium compounds, and thiol compounds.

[2] The curable composition according to [1], wherein the compound selected from the group consisting of phosphoric acid compounds, carboxylic acid compounds, sulfonic acid compounds, primary to tertiary amine compounds, quaternary ammonium compounds, and thiol compounds contains at least one bond selected from the group consisting of an ether bond and an ester bond in a molecular chain.

[3] The curable composition according to [1] or [2], further comprising a quantum dot.

[4] A film formed by curing the curable composition according to any of [1] to [3].

[5] A laminated body comprising the film according to [4] and a layer other than the film.

[6] A display apparatus comprising the film according to [4] or the laminated body according to [5].

Advantageous Effects of Invention

A curable composition comprising a fluorescent particle containing a perovskite compound and a photopolymerizable compound, with a good dispersibility of the above fluorescent particle to the above photopolymerizable compound; a film formed by curing the curable composition; and a laminated body and a display apparatus comprising the film, can be provided.

BRIEF DESCRIPTION OF DRAWINGS

FIG. 1 is a schematic cross-sectional view illustrating one example of a laminated body according to the present invention.

FIG. 2 is a schematic cross-sectional view illustrating one example of a display apparatus according to the present invention;

DESCRIPTION OF EMBODIMENTS

<Curable Composition>

A curable composition according to the present invention (hereinafter, also simply referred to as a "curable compound") comprises a fluorescent particle (A) containing a perovskite compound, a photopolymerizable compound (B), and a dispersing agent (C). According to such a curable composition, the dispersibility of the fluorescent particle (A) containing a perovskite compound to the photopolymerizable compound (B) can be made well.

Such a curable composition can exhibit a good QY maintenance rate. The QY maintenance rate can be calculated as the percentage of the quantum yield QY1 (%) of the curable composition to the quantum yield QY0 (%) of the dispersion liquid containing the fluorescent material compounded into the curable composition, and is represented by the following expression.

$$QY \text{ maintenance rate } (\%) = QY1/QY0$$

When the QY maintenance rate is higher, the quantum yield in the curable composition tends to be higher, which is thus preferable. The QY maintenance rate is preferably greater than 40%, more preferably 50% or more, further preferably 60% or more, even further preferably 70% or more, and particularly preferably 80% or more. QY0 is preferably 40% or more, more preferably 50% or more, further preferably 60% or more, even further preferably 65% or more, and particularly preferably 80% or more.

Although the specific method for measuring QY0 and QY1 follows the description in [Examples], which will be mentioned below, the quantum yield QY0 (%) may be measured by casting a dispersion liquid containing the fluorescent material to be used for the curable composition onto a glass substrate to form an applied layer and using an absolute PL quantum yield spectrometer at an excitation light of 450 nm, at room temperature, and under the atmosphere, and the quantum yield QY1 (%) may be measured by casting the curable composition onto a glass substrate to form an applied layer and using an absolute PL quantum yield spectrometer at an excitation light of 450 nm, at room temperature, and under the atmosphere, for example. As the dispersion liquid, a dispersion liquid (for example, toluene dispersion liquid) containing a fluorescent particle to be used for the curable composition can be used. When the curable composition comprises a fluorescent material other than the fluorescent particle (A), a dispersion liquid with the other fluorescent material added thereto in an amount equal to the mass ratio to the fluorescent particle (A) in the curable composition may be used.

The curable composition according to the present invention has light emitting properties. The term "light emitting properties" refers to a nature of emitting light. The light emitting properties are preferably a nature of emitting light upon excitation and more preferably a nature of emitting light upon excitation by excitation light. The wavelength of the excitation light may be, for example, 200 nm or more and 800 nm or less, may be 250 nm or more and 750 nm or less, and may be 300 nm or more and 700 nm or less.

The curable composition according to the present invention can be used as, for example, a wavelength conversion material for display apparatuses such as a light emitting diode (LED).

Note that the compounds exemplified in the present specification as each component that is included or may be included in the curable composition may be used alone or in combination with a plurality of kinds, unless otherwise noted.

[1] Fluorescent Particle (A) Containing Perovskite Compound

A fluorescent particle (A) containing a perovskite compound [hereinafter, also simply referred to as a "fluorescent particle (A)"] is preferably a fluorescent particle composed of a perovskite compound.

The curable composition may comprise only one kind of fluorescent particle (A) or may comprise two or more kinds thereof.

The perovskite compound is a compound having a perovskite type crystal structure with A, B, and X as the components thereof.

A is a monovalent cation, which is a component positioned at each vertex of the hexahedron centered on B in the perovskite type crystal structure.

X is at least one kind of ion selected from the group consisting of halide ions and a thiocyanate ion, representing a component positioned at each vertex of the octahedron centered on B in the perovskite type crystal structure.

B is a metal ion, which is a component positioned at the center of the hexahedron having A at the vertices thereof and the octahedron having X at the vertices thereof in the perovskite type crystal structure.

Although the particle diameter of the fluorescent particle (A) is not particularly limited, from the viewpoint of maintaining a good crystal structure, the diameter is preferably 1 nm or more, more preferably 2 nm or more, and further preferably 3 nm or more. From the viewpoint of making it difficult for the fluorescent particle (A) to settle in the curable composition, the particle diameter of the fluorescent particle (A) is preferably 10 μm or less, more preferably 1 μm or less, and further preferably 500 nm or less.

The upper limits and the lower limits described above can be arbitrarily combined.

Although the particle diameter of the fluorescent particle (A) is not particularly limited, from the viewpoint of making it difficult for the fluorescent particle (A) to settle in the curable composition and from the viewpoint of maintaining a good crystal structure, the diameter is preferably 1 nm or more and 10 μm or less, more preferably 2 nm or more and 1 μm or less, and further preferably 3 nm or more and 500 nm or less.

Although the particle size distribution of the fluorescent particle (A) is not particularly limited, from the viewpoint of maintaining a good crystal structure, the median diameter D50 is preferably 3 nm or more, more preferably 4 nm or more, and further preferably 5 nm or more. From the viewpoint of making it difficult for the fluorescent particle (A) to settle in the curable composition, the particle size distribution of the fluorescent particle (A) is preferably 5 μm or less, more preferably 500 nm or less, and further preferably 100 nm or less.

The upper limits and the lower limits described above can be arbitrarily combined.

The particle diameter and the particle size distribution of the fluorescent particle (A) can be determined by using a transmission electron microscope (TEM).

The perovskite compound with A, B, and X as the components thereof is not particularly limited and may be a compound having any structure of a three dimensional structure, a two dimensional structure, or a quasi two dimensional structure.

In the case of the three dimensional structure, the perovskite compound is represented by $ABX_{(3+\delta)}$.

In the case of the two dimensional structure, the perovskite compound is represented by $A_2BX_{(4+\delta)}$.

Here, δ is a number that can be changed as appropriate depending on the charge balance of B, and is −0.7 or more and 0.7 or less.

The perovskite compound is preferably a perovskite compound represented by the following general formula (1).

$$ABX_{(3+\delta)} \ (-0.7 \leq \delta \leq 0.7) \quad (1)$$

[In the general formula (1), A represents a monovalent cation, B represents a metal ion, and X represents at least one kind of ion selected from the group consisting of halide ions and a thiocyanate ion.]

In the perovskite compound, A is a monovalent cation, which is a component positioned at each vertex of the hexahedron centered on B in the perovskite type crystal structure described above.

Examples of the monovalent cation include a cesium ion, an organic ammonium ion, or an aminidium ion. When A is a cesium ion, an organic ammonium ion having 3 or less carbon atoms, or an aminidium ion having 3 or less carbon atoms in the perovskite compound, the perovskite compound generally has a three dimensional structure represented by $ABX_{(3+\delta)}$.

A in the perovskite compound is preferably a cesium ion or an organic ammonium ion.

Specific examples of the organic ammonium ion of A include a cation represented by the following general formula (A1).

[Formula 1]

(A1)

In the general formula (A1), $R^6$ to $R^9$ each independently represent a hydrogen atom, an alkyl group optionally having an amino group as the substituent, or a cycloalkyl group optionally having an amino group as the substituent.

The alkyl group represented by $R^6$ to $R^9$ may be linear or branched, or may have an amino group as the substituent.

The number of carbon atoms in the alkyl group represented by $R^6$ to $R^9$ is normally 1 or more and 20 or less, preferably 1 or more and 4 or less, and more preferably 1 or more and 3 or less.

The cycloalkyl group represented by $R^6$ to $R^9$ may have an alkyl group or an amino group as the substituent.

The number of carbon atoms in the cycloalkyl group represented by $R^6$ to $R^9$ is normally 3 or more and 30 or less, preferably 3 or more and 11 or less, and more preferably 3 or more and 8 or less. The number of carbon atoms includes the number of carbon atoms in the substituent, as well.

It is preferable that the group represented by $R^6$ to $R^9$ should be each independently a hydrogen atom or an alkyl group.

By reducing the number of alkyl groups and cycloalkyl groups that can be included in the general formula (A1) and by reducing the number of carbon atoms in the alkyl groups and the cycloalkyl groups, a compound having a three dimensional perovskite type crystal structure with a high quantum yield can be obtained.

When the number of carbon atoms in the alkyl groups or the cycloalkyl groups is 4 or more, a compound can be obtained that partially or entirely has a two dimensional and/or a quasi two dimensional (quasi-2D) perovskite type crystal structure. When the two dimensional perovskite type crystal structure is infinitely laminated, it is equivalent to the three dimensional perovskite type crystal structure (reference: P. P. Boix et al., J. Phys. Chem. Lett. 2015, 6, 898-907, and the like).

The total number of carbon atoms included in the alkyl groups and the cycloalkyl groups represented by $R^6$ to $R^9$ is preferably 1 or more and 4 or less, and it is more preferable that one of $R^6$ to $R^9$ should be an alkyl group having 1 or more and 3 or less carbon atoms and three of $R^6$ to $R^9$ should be hydrogen atoms.

Examples of the alkyl group of $R^6$ to $R^9$ include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a n-hexyl group, a 2-methylpentyl group, a 3-methylpentyl group, a 2,2-dimethylbutyl group, a 2,3-dimethylbutyl group, a n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, a n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

Examples of the cycloalkyl group of $R^6$ to $R^9$ include those in which the alkyl groups having 3 or more carbon atoms exemplified as the alkyl group of $R^6$ to $R^9$ form a ring, and specific examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, a tricyclodecyl group, and the like.

The organic ammonium ion represented by A is preferably $CH_3NH_3^+$ (a methyl ammonium ion), $C_2H_5NH_3^+$ (an ethyl ammonium ion), or $C_3H_7NH_3^+$ (a propyl ammonium ion), more preferably $CH_3NH_3^+$ or $C_2H_5NH_3^+$, and further preferably $CH_3NH_3^+$.

Examples of the aminidium ion represented by A include, for example, an aminidium ion represented by the following general formula (A2).

(A2)

In the general formula (A2), $R^{10}$ to $R^{13}$ each independently represent a hydrogen atom, an alkyl group optionally having an amino group as the substituent, or a cycloalkyl group optionally having an amino group as the substituent.

The alkyl group represented by $R^{10}$ to $R^{13}$ may be linear or branched, or may have an amino group as the substituent.

The number of carbon atoms in the alkyl group represented by $R^{10}$ to $R^{13}$ is normally 1 or more and 20 or less, preferably 1 or more and 4 or less, and more preferably 1 or more and 3 or less.

The cycloalkyl group represented by $R^{10}$ to $R^{13}$ may have an alkyl group or an amino group as the substituent.

The number of carbon atoms in the cycloalkyl group represented by $R^{10}$ to $R^{13}$ is normally 3 or more and 30 or less, preferably 3 or more and 11 or less, and more preferably 3 or more and 8 or less. The number of carbon atoms includes the number of carbon atoms in the substituent.

Specific examples of the alkyl group of $R^{10}$ to $R^{13}$ include the alkyl groups exemplified for $R^6$ to $R^9$.

Specific examples of the cycloalkyl group of $R^{10}$ to $R^{13}$ include the cycloalkyl groups exemplified for $R^6$ to $R^9$.

It is preferable that the group represented by $R^{10}$ to $R^{13}$ should be a hydrogen atom or an alkyl group.

By reducing the number of alkyl groups and cycloalkyl groups that are included in the general formula (A2) and by reducing the number of carbon atoms in the alkyl groups and the cycloalkyl groups, a perovskite compound having a three dimensional structure with a high quantum yield can be obtained.

When the number of carbon atoms in the alkyl groups or the cycloalkyl groups is 4 or more, a compound can be obtained that partially or entirely has a two dimensional and/or a quasi two dimensional (quasi-2D) perovskite type crystal structure.

The total number of carbon atoms included in the alkyl groups and the cycloalkyl groups represented by $R^{10}$ to $R^{13}$ is preferably 1 or more and 4 or less, and it is more preferable that $R^{10}$ should be an alkyl group having 1 or more and 3 or less carbon atoms and $R^{11}$ to $R^{13}$ should be hydrogen atoms.

In the perovskite compound, B is a metal ion, which is a component positioned at the center of the hexahedron having A at the vertices thereof and the octahedron having X at the vertices thereof in the perovskite type crystal structure described above.

The metal ion of the component B may be an ion composed of one or more kinds selected from the group consisting of monovalent metal ions, divalent metal ions, and trivalent metal ions. It is preferable that B should include a divalent metal ion, and it is more preferable that it should include one or more kinds of metal ions selected from the group consisting of lead and tin.

In the perovskite compound, X represents at least one kind of ion selected from the group consisting of halide ions and a thiocyanate ion, representing a component positioned at each vertex of the octahedron centered on B in the perovskite type crystal structure described above.

X may be at least one kind of ion selected from the group consisting of a chloride ion, a bromide ion, a fluoride ion, an iodide ion, and a thiocyanate ion.

Although X can be selected as appropriate depending on a desired emission wavelength, for example, X can include a bromide ion.

When X comprises two or more kinds of halide ions, the content ratio of those halide ions can be selected as appropriate depending on the emission wavelength, and for example, a combination of a bromide ion and a chloride ion or a combination of a bromide ion and an iodide ion can be used.

Preferable examples of the perovskite compound represented by $ABX_{(3+\delta)}$, having a three dimensional perovskite type crystal structure, specifically include
$CH_3NH_3PbBr_3$, $CH_3NH_3PbCl_3$, $CH_3NH_3PbI_3$, $CH_3NH_3PbBr_{(3-y)}I_y$ ($0<y<3$), $CH_3NH_3PbBr_{(3-y)}Cl_y$ ($0<y<3$), $(H_2N=CH-NH_2)PbBr_3$, $(H_2N=CH-NH_2)PbCl_3$, $(H_2N=CH-NH_2)PbI_3$,
$CH_3NH_3Pb_{(1-a)}Ca_aBr_3$ ($0<a\le0.7$), $CH_3NH_3Pb_{(1-a)}Sr_aBr_3$ ($0<a\le0.7$), $CH_3NH_3Pb_{(1-a)}La_aBr_{(3+\delta)}$ ($0<a\le0.7$, $0<\delta\le0.7$), $CH_3NH_3Pb_{(1-a)}Ba_aBr_3$ ($0<a\le0.7$), $CH_3NH_3Pb_{(1-a)}Dy_aBr_{(3+\delta)}$ ($0<a\le0.7$, $0<\delta\le0.7$),
$CH_3NH_3Pb_{(1-a)}Na_aBr_{(3+\delta)}$ ($0<a\le0.7$, $-0.7\le\delta<0$), $CH_3NH_3Pb_{(1-a)}Li_aBr_{(3+\delta)}$ ($0<a\le0.7$, $-0.7\le\delta<0$),
$CsPb_{(1-a)}Na_aBr_{(3+\delta)}$ ($0<a\le0.7$, $-0.7\le\delta<0$), $CsPb_{(1-a)}Li_aBr_{(3+\delta)}$ ($0<a\le0.7$, $-0.7\le\delta<0$),
$CH_3NH_3Pb_{(1-a)}Na_aBr_{(3+\delta-y)}I_y$ ($0<a\le0.7$, $-0.7\le\delta<0$, $0<y<3$), $CH_3NH_3Pb_{(1-a)}Li_aBr_{(3+\delta-y)}I_y$ ($0<a\le0.7$, $-0.7\le\delta<0$, $0<y<3$), $CH_3NH_3Pb_{(1-a)}Na_aBr_{(3+\delta-y)}Cl_y$ ($0<a\le0.7$, $-0.7\le\delta<0$, $0<y<3$), $CH_3NH_3Pb_{(1-a)}Li_aBr_{(3+\delta-y)}Cl_y$ ($0<a\le0.7$, $-0.7\le\delta<0$, $0<y<3$),
$(H_2N=CH-NH_2)Pb_{(1-a)}Na_aBr_{(3+\delta)}$ ($0<a\le0.7$, $-0.7\le\delta<0$), $(H_2N=CH-NH_2)Pb_{(1-a)}Li_aBr_{(3+\delta)}$ ($0<a\le0.7$, $-0.7\le\delta<0$), $(H_2N=CH-NH_2)Pb_{(1-a)}Na_aBr_{(3+\delta-y)}I_y$ ($0<a\le0.7$, $-0.7\le\delta<0$, $0<y<3$), $(H_2N=CH-NH_2)Pb_{(1-a)}Na_aBr_{(3+\delta-y)}Cl_y$ ($0<a\le0.7$, $-0.7\le\delta<0$, $0<y<3$),
$CsPbBr_3$, $CsPbCl_3$, $CsPbI_3$, $CsPbBr_{(3-y)}I_y$ ($0<y<3$), $CsPbBr_{(3-y)}Cl_y$ ($0<y<3$), $CH_3NH_3PbBr_{(3-y)}Cl_y$ ($0<y<3$), $CH_3NH_3Pb_{(1-a)}Zn_aBr_3$ ($0<a\le0.7$), $CH_3NH_3Pb_{(1-a)}Al_aBr_{(3+\delta)}$ ($0<a\le0.7$, $0\le\delta\le0.7$), $CH_3NH_3Pb_{(1-a)}Co_aBr_3$ ($0<a\le0.7$), $CH_3NH_3Pb_{(1-a)}Mn_aBr_3$ ($0<a\le0.7$), $CH_3NH_3Pb_{(1-a)}Mg_aBr_3$ ($0<a\le0.7$),
$CsPb_{(1-a)}Zn_aBr_3$ ($0<a\le0.7$), $CsPb_{(1-a)}Al_aBr_{(3+\delta)}$ ($0<a\le0.7$, $0<\delta\le0.7$), $CsPb_{(1-a)}Co_aBr_3$ ($0<a\le0.7$), $CsPb_{(1-a)}Mn_aBr_3$ ($0<a\le0.7$), $CsPb_{(1-a)}Mg_aBr_3$ ($0<a\le0.7$),
$CH_3NH_3Pb_{(1-a)}Zn_aBr_{(3-y)}I_y$ ($0<a\le0.7$, $0<y<3$), $CH_3NH_3Pb_{(1-a)}Al_aBr_{(3+\delta-y)}I_y$ ($0<a\le0.7$, $0<\delta\le0.7$, $0<y<3$), $CH_3NH_3Pb_{(1-a)}Co_aBr_{(3-y)}I_y$ ($0<a\le0.7$, $0<y<3$), $CH_3NH_3Pb_{(1-a)}Mn_aBr_{(3-y)}I_y$ ($0<a\le0.7$, $0<y<3$), $CH_3NH_3Pb_{(1-a)}Mg_aBr_{(3-y)}I_y$ ($0<a\le0.7$, $0<y<3$), $CH_3NH_3Pb_{(1-a)}Zn_aBr_{(3-y)}Cl_y$ ($0<a\le0.7$, $0<y<3$), $CH_3NH_3Pb_{(1-a)}Al_aBr_{(3+\delta-y)}Cl_y$ ($0<a\le0.7$, $0<\delta\le0.7$, $0<y<3$), $CH_3NH_3Pb_{(1-a)}Co_aBr_{(3+\delta-y)}Cl_y$ ($0<a\le0.7$, $0<y<3$), $CH_3NH_3Pb_{(1-a)}Mn_aBr_{(3-y)}Cl_y$ ($0<a\le0.7$, $0<y<3$), $CH_3NH_3Pb_{(1-a)}Mg_aBr_{(3-y)}Cl_y$ ($0<a\le0.7$, $0<y<3$),
$(H_2N=CH-NH_2)Zn_aBr_3$ ($0<a\le0.7$), $(H_2N=CH-NH_2)Mg_aBr_3$ ($0<a\le0.7$), $(H_2N=CH-NH_2)Pb_{(1-a)}Zn_aBr_{(3-y)}I_y$ ($0<a\le0.7$, $0<y<3$), $(H_2N=CH-NH_2)Pb_{(1-a)}Zn_aBr_{(3-y)}Cl_y$ ($0<a\le0.7$, $0<y<3$), and the like.

Preferable examples of the perovskite compound represented by $A_2BX_{(4+\delta)}$, having a two dimensional perovskite type crystal structure, specifically include
$(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}$ ($0<a\le0.7$, $-0.7\le\delta<0$), $(C_4H_9NH_3)_2Pb_{(1-a)}Na_aBr_{(4+\delta)}$ ($0<a\le0.7$, $-0.7\le\delta<0$), $(C_4H_9NH_3)_2Pb_{(1-a)}Rb_aBr_{(4+\delta)}$ ($0<a\le0.7$, $-0.7\le\delta<0$),
$(C_7H_{15}NH_3)_2Pb_{(1-a)}Na_aBr_{(4+\delta)}$ ($0<a\le0.7$, $-0.7\le\delta<0$), $(C_7H_{15}NH_3)_2Pb_{(1-a)}Li_aBr_{(4+\delta)}$ ($0<a\le0.7$, $-0.7\le\delta<0$), $(C_7H_{15}NH_3)_2Pb_{(1-a)}Rb_aBr_{(4+\delta)}$ ($0<a\le0.7$, $-0.7\le\delta<0$),
$(C_4H_9NH_3)_2Pb_{(1-a)}Na_aBr_{(4+\delta-y)}I_y$ ($0<a\le0.7$, $-0.7\le\delta<0$, $0<y<4$), $(C_4H_9NH_3)_2Pb_{(1-a)}Li_aBr_{(4+\delta-y)}I_y$ ($0<a\le0.7$, $-0.7\le\delta<0$, $0<y<4$), $(C_4H_9NH_3)_2Pb_{(1-a)}Rb_aBr_{(4+\delta-y)}I_y$ ($0<a\le0.7$, $-0.7\le\delta<0$, $0<y<4$),
$(C_4H_9NH_3)_2Pb_{(1-a)}Na_aBr_{(4+\delta-y)}Cl_y$ ($0<a\le0.7$, $-0.7\le\delta<0$, $0<y<4$), $(C_4H_9NH_3)_2Pb_{(1-a)}Li_aBr_{(4+\delta-y)}Cl_y$ ($0<a\le0.7$, $-0.7\le\delta<0$, $0<y<4$), $(C_4H_9NH_3)_2Pb_{(1-a)}Rb_aBr_{(4+\delta-y)}Cl_y$ ($0<a\le0.7$, $-0.7\le\delta<0$, $0<y<4$),
$(C_4H_9NH_3)_2PbBr_4$, $(C_7H_{15}NH_3)_2PbBr_4$, $(C_4H_9NH_3)_2PbBr_{(4-y)}Cl_y$ ($0<y<4$), $(C_4H_9NH_3)_2PbBr_{(4-y)}I_y$ ($0<y<4$),
$(C_4H_9NH_3)_2Pb_{(1-a)}Zn_aBr_4$ ($0<a\le0.7$), $(C_4H_9NH_3)_2Pb_{(1-a)}Mg_aBr_4$ ($0<a\le0.7$), $(C_4H_9NH_3)_2Pb_{(1-a)}Co_aBr_4$ ($0<a\le0.7$), $(C_4H_9NH_3)_2Pb_{(1-a)}Mn_aBr_4$ ($0<a\le0.7$),
$(C_7H_{15}NH_3)_2Pb_{(1-a)}Zn_aBr_4$ ($0<a\le0.7$), $(C_7H_{15}NH_3)_2Pb_{(1-a)}Mg_aBr_4$ ($0<a\le0.7$), $(C_7H_{15}NH_3)_2Pb_{(1-a)}Co_aBr_4$ ($0<a\le0.7$), $(C_7H_{15}NH_3)_2Pb_{(1-a)}Mn_aBr_4$ ($0<a\le0.7$),
$(C_4H_9NH_3)_2Pb_{(1-a)}Zn_aBr_{(4-y)}I_y$ ($0<a\le0.7$, $0<y<4$), $(C_4H_9NH_3)_2Pb_{(1-a)}Mg_aBr_{(4-y)}I_y$ ($0<a\le0.7$, $0<y<4$), $(C_4H_9NH_3)_2Pb_{(1-a)}Co_aBr_{(4-y)}I_y$ ($0<a\le0.7$, $0<y<4$), $(C_4H_9NH_3)_2Pb_{(1-a)}Mn_aBr_{(4-y)}I_y$ ($0<a\le0.7$, $0<y<4$),
$(C_4H_9NH_3)_2Pb_{(1-a)}Zn_aBr_{(4-y)}Cl_y$ ($0<a\le0.7$, $0<y<4$), $(C_4H_9NH_3)_2Pb_{(1-a)}Mg_aBr_{(4-y)}Cl_y$ ($0<a\le0.7$, $0<y<4$), $(C_4H_9NH_3)_2Pb_{(1-a)}Co_aBr_{(4-y)}Cl_y$ ($0<a\le0.7$, $0<y<4$), $(C_4H_9NH_3)_2Pb_{(1-a)}Mn_aBr_{(4-y)}Cl_y$ ($0<a\le0.7$, $0<y<4$), and the like.

The perovskite compound is a light emitter that is capable of emitting fluorescence in the visible light wavelength region, and when X is a bromide ion, it can emit fluorescence with a maximum peak of intensity in the wavelength range, normally at 480 nm or more, preferably at 500 nm or more, and more preferably at 520 nm or more, and normally at 700 nm or less, preferably at 600 nm or less, and more preferably at 580 nm or less.

The upper limits and the lower limits described above can be arbitrarily combined.

When X is an iodide ion, the perovskite compound can emit fluorescence with a maximum peak of intensity in the wavelength range, normally at 520 nm or more, preferably at 530 nm or more, and more preferably at 540 nm or more, and normally at 800 nm or less, preferably at 750 nm or less, and more preferably at 730 nm or less.

The upper limits and the lower limits described above can be arbitrarily combined.

When X is a chloride ion, the perovskite compound can emit fluorescence with a maximum peak of intensity in the wavelength range, normally at 300 nm or more, preferably at 310 nm or more, and more preferably at 330 nm or more, and normally at 600 nm or less, preferably at 580 nm or less, and more preferably at 550 nm or less.

The upper limits and the lower limits described above can be arbitrarily combined.

The fluorescent particle (A) can be, for example, a red fluorescent particle, a green fluorescent particle, or a blue fluorescent particle. Upon irradiation of light, the red fluorescent particle releases red light, the green fluorescent particle releases green light, and the blue fluorescent particle releases blue light.

Although the content of the fluorescent particle (A) in the curable composition is not particularly limited, from the viewpoint of making it difficult for the fluorescent particle (A) to be condensed and from the viewpoint of preventing concentration quenching, it is preferably 50% by mass or less in 100% by mass of the curable composition, more preferably 5% by mass or less, and further preferably 1% by mass or less. In addition, from the viewpoint of obtaining a good emission intensity, the content is preferably 0.0001% by mass or more, more preferably 0.001% by mass or more, and further preferably 0.01% by mass or more.

The upper limits and the lower limits described above can be arbitrarily combined.

The content of the fluorescent particle (A) in the curable composition is normally 0.0001% by mass or more and 50% by mass or less in 100% by mass of the curable composition.

The content of the fluorescent particle (A) in the curable composition is preferably 0.0001% by mass or more and 5% by mass or less in 100% by mass of the curable composition, and is more preferably 0.0005% by mass or more and 2% by mass or less.

A composition in which the content of the fluorescent particle (A) is within the range described above is preferable in that the aggregation of the fluorescent particle (A) is less likely to occur and the light emitting properties are also demonstrated well.

[2] Photopolymerizable Compound (B)

A photopolymerizable compound (B) is a curable component contained in the curable composition.

The photopolymerizable compound refers to a compound having a polymerizable unsaturated group that can be polymerized by irradiating with light such as ultraviolet light and visible light.

The curable composition may comprise only one kind of photopolymerizable compound (B) or may comprise two or more kinds thereof.

Although the photopolymerizable compound (B) is not particularly limited as long as it is a compound having one or more polymerizable unsaturated groups, it may include a compound with a relatively high polarity, and from the viewpoint of increasing the quantum yield of the curable composition itself, it preferably includes a (meth)acrylic compound as the compound with a relatively high polarity.

Although there is a concern that a photopolymerizable compound with a relatively high polarity would dissolve the fluorescent particle (A), the curable composition according to one embodiment of the present invention that uses a (meth) acrylic compound as the photopolymerizable compound (B) can not only increase the quantum yield of the curable composition itself without the concern described above, but also make the dispersibility of the fluorescent particle (A) to the (meth)acrylic compound as the photopolymerizable compound (B) well.

The term (meth)acrylic compound means a compound having one or more of at least one kind selected from the group consisting of a methacryloyl group and an acryloyl group in the molecule.

In the same manner, (meth)acryloyl means at least one kind selected from the group consisting of methacryloyl and acryloyl.

(Meth)acryloyloxy means at least one kind selected from the group consisting of methacryloyloxy and acryloyloxy.

(Meth)acrylate means at least one kind selected from the group consisting of methacrylate and acrylate.

From the viewpoint of enhancing the optical characteristics of the cured film, the greater the content of the (meth) acrylic compound in the photopolymerizable compound (B), the more preferable it is. Such a content is more preferably 50% by mass or more in 100% by mass of the photopolymerizable compound (B), and further preferably 70% by mass or more. The photopolymerizable compound (B) may be composed solely of a (meth)acrylic compound.

From the viewpoint of enhancing the curability of the curable composition, it is preferable that the (meth)acrylic compound should be an acrylic compound among acrylic compounds and methacrylic compounds. It is more preferable that the photopolymerizable compound (B) should be composed solely of an acrylic compound.

The acrylic compound means a compound having one or more acryloyl groups in the molecule and not having a methacryloyl group.

The methacrylic compound means a compound having one or more methacryloyl groups in the molecule and not having an acryloyl group.

The acrylic compound is preferably an acrylate compound.

The acrylate compound means a compound having one or more acryloyloxy groups in the molecule and not having a methacryloyloxy group. One typical example of the acrylate compound is an acrylic acid ester.

Examples of the (meth)acrylic compound having one (meth)acryloyloxy group in the molecule as the polymerizable unsaturated group described above include methyl (meth)acrylate, ethyl (meth)acrylate, methoxyethyl (meth)acrylate, ethoxyethyl (meth)acrylate, n-propyl (meth)acrylate, isopropyl (meth)acrylate, n-butyl (meth)acrylate, isobutyl (meth)acrylate, tert-butyl (meth)acrylate, 2-ethylhexyl (meth)acrylate, cyclohexyl (meth)acrylate, heptyl (meth)acrylate, octyl (meth)acrylate, nonyl (meth)acrylate, dodecyl (meth)acrylate, lauryl (meth)acrylate, stearyl (meth)acrylate, cyclopentyl (meth)acrylate, cyclohexyl (meth)acrylate, 2-methylcyclohexyl (meth)acrylate, isobornyl (meth)acrylate, adamantyl (meth)acrylate, allyl (meth)acrylate, propargyl (meth)acrylate, phenyl (meth)acrylate, naphthyl (meth)acrylate, benzyl (meth)acrylate, nonylphenylcarbitol (meth)acrylate, 2-hydroxy-3-phenoxypropyl (meth)acrylate, 2-ethylhexylcarbitol (meth)acrylate, 2-hydroxyethyl (meth)acrylate, 2-hydroxypropyl (meth)acrylate, and the like.

Examples of the (meth)acrylic compound having two (meth)acryloyloxy groups in the molecule as the polymerizable unsaturated group described above include ethylene glycol di(meth)acrylate, triethylene glycol di(meth)acrylate, neopentyl glycol di(meth)acrylate, 1,6-hexanediol di(meth)acrylate, 1,7-heptanediol di(meth)acrylate, 1,8-ocatanediol di(meth)acrylate, 1,9-nonanediol di(meth)acrylate, 1,10-decanediol di(meth)acrylate, bis[(meth)acryloyloxyethyl] ether of bisphenol A, 3-ethylpentanediol di(meth)acrylate, and the like.

Examples of the (meth)acrylic compound having three or more (meth)acryloyloxy groups in the molecule as the polymerizable unsaturated group described above include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta(meth)acrylate, tetrapentaerythritol deca(meth)acrylate, tetrapentaerythritol nona(meth)acrylate, ethylene glycol modified trimethylolpropane tri(meth)acrylate, propylene glycol modified trimethylolpropane tri(meth)acrylate, ethylene glycol modified pentaerythritol tetra(meth)acrylate, propylene glycol modified pentaerythritol tetra (meth)acrylate, ethylene glycol modified dipentaerythritol hexa(meth)acrylate, propylene glycol modified dipentaerythritol hexa(meth)acrylate, caprolactone modified pentaerythritol tetra(meth)acrylate, caprolactone modified dipentaerythritol hexa(meth)acrylate, dipentaerythritol penta(meth)acrylate succinic acid monoester, tris(2-(meth)acryloyloxyethyl) isocyanurate, and the like.

Although the content of the photopolymerizable compound (B) in the curable composition is not particularly limited, it is, for example, 5% by mass or more and 99% by mass or less in 100% by mass of the solid content of the curable composition, preferably 10% by mass or more and 99% by mass or less, more preferably 20% by mass or more and 99% by mass or less, further preferably 40% by mass or more and 99% by mass or less, and even further preferably 50% by mass or more and 99% by mass or less.

When the content of the photopolymerizable compound (B) is within the range described above, there is a tendency that the mechanical characteristics and optical characteristics of the cured film of the curable composition are good.

The solid content of the curable composition shall refer to the total of all components contained in the curable composition, excluding the solvent.

[3] Dispersing Agent (C)

The curable composition comprises a dispersing agent (C). As a result of this, the dispersibility of the fluorescent particle (A) containing a perovskite compound to the photopolymerizable compound (B) can be made well.

The curable composition may comprise only one kind of dispersing agent (C) or may comprise two or more kinds thereof.

Examples of the dispersing agent (C) include a dispersing agent containing a compound having a polar functional group that is adsorbed onto the fluorescent particle (A) to stabilize the dispersion of the fluorescent particle (A) to the photopolymerizable compound (B).

The compound having a polar functional group described above is, from the viewpoint of enhancing the dispersibility of the fluorescent particle (A) to the photopolymerizable compound (B), at least one kind of compound selected from the group consisting of phosphoric acid compounds, carboxylic acid compounds, sulfonic acid compounds, primary to tertiary amine compounds, quaternary ammonium compounds, and thiol compounds, and the curable composition of the present invention comprises at least one kind of compound selected from the group consisting of these compounds.

Among the above, from the viewpoint of enhancing the dispersibility of the fluorescent particle (A) to the photopolymerizable compound (B) and from the viewpoint of increasing the quantum yield of the curable composition itself, the compound having a polar functional group described above is preferably at least one kind of compound selected from the group consisting of phosphoric acid compounds, carboxylic acid compounds, and tertiary amine compounds.

In the present specification, the phosphoric acid compound means a compound having one or two or more polar functional groups represented by *—O—P(=O)(OR')(OR"). In the formula, * represents a bonding hand with another structural moiety in the phosphoric acid compound. R' and R" each independently represent a hydrogen atom or a monovalent organic group. The polar functional group represented by the above formula may form a salt.

The carboxylic acid compound means a compound having one or two or more carboxy groups. The carboxy group may form a salt.

The sulfonic acid compound means a compound having one or two or more sulfo groups. The sulfo group may form a salt.

The primary to tertiary amine compound means a compound having one or two or more polar functional groups represented by the following formula.

[Formula 2]

In the formula, * represents a bonding hand with another structural moiety in the primary to tertiary amine compound. $R^1$ and $R^2$ each independently represent a hydrogen atom or a monovalent organic group. When $R^1$ and $R^2$ are hydrogen atoms, such a compound is a primary amine compound; when one of $R^1$ and $R^2$ is a monovalent organic group, such a compound is a secondary amine compound; and when $R^1$ and $R^2$ are monovalent organic groups, such a compound is a tertiary amine compound. The polar functional group represented by the above formula may form a salt.

The quaternary ammonium compound means a compound having one or two or more polar functional groups represented by the following formula.

[Formula 3]

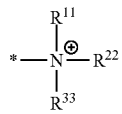

In the formula, * represents a bonding hand with another structural moiety in the quaternary ammonium compound. $R^{11}$, $R^{22}$, and $R^{33}$ each independently represent a hydrogen atom or a monovalent organic group. The polar functional group represented by the above formula may form a salt.

The thiol compound means a compound having one or two or more —SH groups.

The compound having a polar functional group described above is, for example, a resin having the polar functional group described above. The resin backbone may be, for example, one containing a polyurethane backbone, a polyester backbone, a poly(meth)acrylic backbone, a polyether backbone, a polyamide backbone, an aliphatic backbone, or the like in the main chain or side chain.

In particular, from the viewpoint of increasing the quantum yield of the curable composition itself, the compound having a polar functional group described above preferably contains at least one bond selected from the group consisting of an ether bond and an ester bond in the molecular chain, and when the compound having a polar functional group described above is a resin, such a resin preferably contains at least one bond selected from the group consisting of an ether bond and an ester bond in the polymer chain, and more preferably contains at least one selected from the group consisting of a polyether chain and a polyester chain in the molecular chain.

The polyether backbone is preferably a poly(oxyalkylene) chain from the viewpoint of increasing the quantum yield of the curable composition itself.

The polar sites described above, such as an ether bond and an ester bond, as well as a polyether chain and a polyester chain, effectively serve as a site that exhibits compatibility with the photopolymerizable compound (B), particularly a photopolymerizable compound (B) with a high polarity, which can further enhance the dispersibility of the fluorescent particle (A) to the photopolymerizable compound (B).

As the resin type dispersing agent comprising a resin having the polar functional group described above, commercial products can be used as well. Examples of such commercial products include:

DISPERBYK-101, 102, 103, 106, 107, 108, 109, 110, 111, 116, 118, 130, 140, 154, 161, 162, 163, 164, 165, 166, 170, 171, 174, 180, 181, 182, 183, 184, 185, 190, 192, 2000, 2001, 2020, 2025, 2050, 2070, 2095, 2150, 2155; ANTI-

TERRA-U, U100, 203, 204, 250; BYK-P104, P104S, P105, 220S, and 6919; BYK-LPN6919 and 21116; LACTIMON and LACTIMON-WS; Bykumen; and the like, manufactured by BYK Japan KK.;

SOLSPERSE-3000, 9000, 13000, 13240, 13650, 13940, 16000, 17000, 18000, 20000, 21000, 24000, 26000, 27000, 28000, 31845, 32000, 32500, 32550, 33500, 32600, 34750, 35100, 36600, 38500, 41000, 41090, 53095, 55000, 76500, and the like, manufactured by Lubrizol Japan Limited;

EFKA-46, 47, 48, 452, 4008, 4009, 4010, 4015, 4020, 4047, 4050, 4055, 4060, 4080, 4400, 4401, 4402, 4403, 4406, 4408, 4300, 4310, 4320, 4330, 4340, 450, 451, 453, 4540, 4550, 4560, 4800, 5010, 5065, 5066, 5070, 7500, 7554, 1101, 120, 150, 1501, 1502, 1503, and the like, manufactured by BASF SE;

AJISPER PA111, PB711, PB821, PB822, and PB824, manufactured by Ajinomoto Fine-Techno Co., Inc.; and the like.

The content of the dispersing agent (C) in the curable composition is, from the viewpoint of enhancing the dispersibility of the fluorescent particle (A) to the photopolymerizable compound (B), for example, 0.1 parts by mass or more and 20 parts by mass or less relative to 1 part by mass of the fluorescent particle, preferably 0.2 parts by mass or more and 10 parts by mass or less, and more preferably 0.3 parts by mass or more and 5 parts by mass or less.

[4] Photopolymerization Initiator (D)

It is preferable that the curable composition should comprise a photopolymerization initiator (D).

A photopolymerization initiator (D) is not particularly limited as long as it is a compound that generates active radicals, acids, and the like under the action of light and can initiate the polymerization of the photopolymerizable compound (B).

The curable composition may comprise only one kind of photopolymerization initiator (D) or may comprise two or more kinds thereof.

Although the photopolymerization initiator (D) is not particularly limited, examples thereof include oxime based compounds such as O-acyloxime compounds, alkylphenone compounds, acylphosphine oxide compounds, and the like. Preferable examples of the photopolymerization initiator include oxime based compounds such as O-acyloxime compounds.

The O-acyloxime compound is a compound having the structure represented by the following formula (d). Hereinafter, * represents a bonding hand.

[Formula 4]

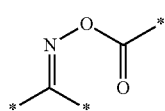

(d)

Examples of the O-acyloxime compound include N-benzoyloxy-1-(4-phenylsulfanylphenyl)butan-1-one-2-imine, N-benzoyloxy-1-(4-phenylsulfanylphenyl)octan-1-one-2-imine, N-benzoyloxy-1-(4-phenylsulfanylphenyl)-3-cyclopentylpropan-1-one-2-imine, N-acetoxy-1-[9-ethyl-6-(2-methylbenzoyl)-9H-carbazol-3-yl]ethane-1-imine, N-acetoxy-1-[9-ethyl-6-{2-methyl-4-(3,3-dimethyl-2,4-dioxacyclopentanylmethyloxy)benzoyl}-9H-carbazol-3-yl]ethane-1-imine, N-acetoxy-1-[9-ethyl-6-(2-methylbenzoyl)-9H-carbazol-3-yl]-3-cyclopentylpropane-1-imine, N-benzoyloxy-1-[9-ethyl-6-(2-methylbenzoyl)-9H-carbazol-3-yl]-3-cyclopentylpropan-1-one-2-imine, N-acetyloxy-1-[4-(2-hydroxyethyloxy)phenylsulfanylphenyl]propan-1-one-2-imine, N-acetyloxy-1-[4-(1-methyl-2-methoxyethoxy)-2-methylphenyl]-1-(9-ethyl-6-nitro-9H-carbazol-3-yl)methan-1-imine, and the like.

Commercial products such as IRGACURE (trade name) OXE01, OXE02, and OXE03 (all manufactured by BASF SE), and N-1919, NCI-930, and NCI-831 (all manufactured by ADEKA CORPORATION) may be used as well.

The alkylphenone compound is a compound having a substructure represented by the following formula (d4) or a substructure represented by the following formula (d5). In these substructures, the benzene ring optionally has a substituent.

[Formula 5]

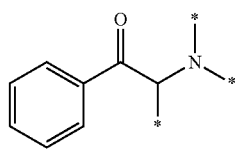

(d4)

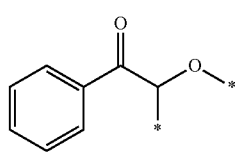

(d5)

Examples of the compound having a structure represented by the formula (d4) include 2-methyl-2-morpholino-1-(4-methylsulfanylphenyl)propan-1-one, 2-dimethylamino-1-(4-morpholinophenyl)-2-benzylbutan-1-one, 2-(dimethylamino)-2-[(4-methylphenyl)methyl]-1-[4-(4-morpholinyl)phenyl]butan-1-one, and the like.

Commercial products such as Omnirad (trade name) 369, 907, and 379 (all manufactured by IGM Resins B.V.) may be used as well.

Examples of the compound having a structure represented by the formula (d5) include 2-hydroxy-2-methyl-1-phenyl-propan-1-one, 2-hydroxy-2-methyl-1-[4-(2-hydroxyethoxy)phenyl]propan-1-one, 1-hydroxycyclohexyl phenyl ketone, an oligomer of 2-hydroxy-2-methyl-1-(4-isopropenylphenyl)propan-1-one, α,α-diethoxyacetophenone, benzyl dimethyl ketal, and the like.

Examples of the acylphosphine oxide compound include phenylbis(2,4,6-trimethylbenzoyl)phosphine oxide (for example, trade name "omnirad 819" (manufactured by IGM Resins B.V.)), 2,4,6-trimethylbenzoyldiphenylphosphine oxide, and the like. Since acylphosphine oxide compounds have a photobleaching effect, they can be preferably used in order to obtain a cured film with a thickness of 10 μm or more.

Further examples of the photopolymerization initiator (D) include:

benzoin compounds such as benzoin, benzoin methyl ether, benzoin ethyl ether, benzoin isopropyl ether, and benzoin isobutyl ether;

benzophenone compounds such as benzophenone, methyl o-benzoylbenzoate, 4-phenylbenzophenone, 4-benzoyl 4'-methyldiphenyl sulfide, 3,3',4,4'-tetra(tert-butylperoxycarbonyl)benzophenone, 2,4,6-trimethylbenzophenone, and 4,4'-di(N,N'-dimethylamino)-benzophenone;

xanthone compounds such as 2-isopropylthioxanthone and 2,4-diethylthioxanthone;

anthracene compounds such as 9,10-dimethoxyanthracene, 2-ethyl-9,10-dimethoxyanthracene, 9,10-diethoxyanthracene, and 2-ethyl-9,10-diethoxyanthracene;

quinone compounds such as 9,10-phenanthrenequinone, 2-ethylanthraquinone, and camphorquinone;

benzil, methyl phenylglyoxylate, titanocene compounds; and the like.

In addition, examples of the photopolymerization initiator having a relatively low absorbance for light at a wavelength of 365 nm include, for example, 2-methyl-1-[4-(methylthio)phenyl]-2-morpholinopropan-1-one, 4-methoxy-3,3'-dimethylbenzophenone, 2,2-dimethoxy-1,2-diphenylethan-1-one, 1-hydroxy-cyclohexyl phenyl ketone, 1-[4-(2-hydroxyethoxy)-phenyl]-2-hydroxy-2-methyl-1-propan-1-one, 2-hydroxy-1-1{4-[4-(2-hydroxy-2-methyl-propionyl)-benzyl]-phenyl}-2-methyl-propan-1-one, trimethylolpropane tris(3-mercaptopropionate), 2-dimethyl-amino-2-(4-methyl-benzyl)-1-(4-morpholin-4-yl-phenyl)-butan-1-one, and compounds represented by the following formulas, and the like.

[Formula 6]

[chemical structures]

Although the content of the photopolymerization initiator (D) in the curable composition is not particularly limited, it is, for example, 0.02% by mass or more and 20% by mass or less in 100% by mass of the solid content of the curable composition, preferably 0.05% by mass or more and 10% by mass or less, more preferably 0.1% by mass or more and 5% by mass or less, further preferably 0.2% by mass or more and 5% by mass or less, and even further preferably 0.3% by mass or more and 5% by mass or less.

When the content of the photopolymerization initiator (D) is within the range described above, there is a tendency that both curability and optical characteristics can be achieved.

[5] Quantum Dot (E)

The curable composition can further comprise a fluorescent material other than the fluorescent particle (A), and preferably, can further comprise a quantum dot (E). When the curable composition further comprises the quantum dot (E) in addition to the fluorescent particle (A), the color of emitted light emitted by the curable composition or the cured film thereof can be more readily adjusted and a higher color gamut can also be achieved in a display apparatus or the like equipped with such a cured film.

The curable composition may comprise only one kind of quantum dot (E) or may comprise two or more kinds thereof.

The quantum dot (E) is not particularly limited as long as it is a quantum dot particle that is capable of emitting fluorescence in the visible light wavelength region, and it can be selected from the group consisting of, for example, II-VI semiconductor compounds; III-V semiconductor compounds; IV-VI semiconductor compounds; group IV elements or compounds containing the same; and combinations thereof. These quantum dots may be used alone, or two or more kinds thereof may be used in mixture.

The II-VI semiconductor compounds can be selected from the group consisting of: binary compounds selected from the group consisting of CdS, CdSe, CdTe, ZnS, ZnSe, ZnTe, ZnO, HgS, HgSe, HgTe, and mixtures thereof; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, ternary compounds selected from the group consisting of HgZnS, HgZnSe, HgZnTe, and mixtures thereof; and quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, and mixtures thereof.

The III-V semiconductor compounds described above can be selected from the group consisting of: binary compounds selected from the group consisting of GaN, GaP, GaAs, GaSb, AlN, AlP, AlAs, AlSb, InN, InP, InAs, InSb, and mixtures thereof; GaNP, GaNAs, GaNSb, GaPAs, GaPSb, AlNP, AlNAs, AlNSb, AlPAs, AlPSb, InNP, InNAs, InNSb, ternary compounds selected from the group consisting of InPAs, InPSb, GaAlNP, and mixtures thereof; and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The IV-VI semiconductor compounds described above can be selected from the group consisting of: binary compounds selected from the group consisting of SnS, SnSe, SnTe, PbS, PbSe, PbTe, and mixtures thereof; ternary compounds selected from the group consisting of SnSeS, SnSeTe, SnSTe, PbSeS, PbSeTe, PbSTe, SnPbS, SnPbSe, SnPbTe, and mixtures thereof; and quaternary compounds selected from the group consisting of SnPbSSe, SnPbSeTe, SnPbSTe, and mixtures thereof.

The group IV elements or compounds containing the same described above can be selected from the group consisting of: element compounds selected from the group consisting of Si, Ge, and mixtures thereof; and binary compounds selected from the group consisting of SiC, SiGe, and mixtures thereof.

The quantum dot (E) can have a homogeneous single structure; a dual structure such as core-shell or gradient structure; or a mixed structure thereof.

In the core-shell dual structure, the substances constituting the core and the shell can be composed of the aforementioned semiconductor compounds that are different from each other. For example, the core described above can comprise one or more substances selected from the group consisting of, without limitations, CdSe, CdS, ZnS, ZnSe, ZnTe, CdTe, CdSeTe, CdZnS, PbSe, AgInZnS, HgS, HgSe, HgTe, GaN, GaP, GaAs, InP, InAs, and ZnO.

For example, the shell described above can comprise one or more substances selected from the group consisting of, without limitations, CdSe, ZnSe, ZnS, ZnTe, CdTe, PbS, TiO, SrSe, and HgSe.

Just as a coloring photosensitive resin composition used in the production of ordinary color filters comprises a red, green, or blue colorant for embodying the color phase, particles of photoluminescent quantum dots can be classified into a red quantum dot particle, a green quantum dot particle, and a blue quantum dot particle.

The quantum dot (E) can be a red quantum dot particle, a green quantum dot particle, or a blue quantum dot particle.

Although the diameter of the quantum dot (E) is not particularly limited, red, green, and blue quantum dot particles can be classified according to the particle diameter, with the particle diameter being smaller in the order of red, green, and blue.

Specifically, the red quantum dot particle can have a particle diameter of 5 nm or more and 10 nm or less, the green quantum dot particle can have a particle diameter of greater than 3 nm and 5 nm or less, and the blue quantum dot particle can have a particle diameter of 1 nm or more and 3 nm or less.

Upon irradiation of light, the red quantum dot particle releases red light, the green quantum dot particle releases green light, and the blue quantum dot particle releases blue light.

The quantum dot (E) can be synthesized by a wet chemical process, a metal organic chemical vapor deposition process, or a molecular beam epitaxy process. The wet chemical process is a method in which a precursor material is placed in an organic solvent to grow particles. During crystal growth, the organic solvent naturally coordinates to the surface of the quantum dot crystal and acts as a dispersing agent to regulate crystal growth, and thus, the growth of nanoparticles can be controlled through an easier and less expensive process compared to vapor deposition methods such as metal organic chemical vapor deposition (MOCVD) and molecular beam epitaxy (MBE).

In one preferable embodiment, the curable composition comprises a fluorescent particle (A) and a quantum dot (E), wherein the fluorescent particle (A) is a green fluorescent particle and the quantum dot (E) is a red quantum dot particle.

The content of the quantum dot (E) in the curable composition is not particularly limited and can be selected in consideration of a desired color of emitted light and the like. The content of the quantum dot (E) in 100% by mass of the curable composition is preferably 50% by mass or less, more preferably 5% by mass or less, and further preferably 1% by mass or less. In addition, from the viewpoint of obtaining a good emission intensity, the content is preferably 0.0001% by mass or more, more preferably 0.0005% by mass or more, and further preferably 0.001% by mass or more.

The upper limits and the lower limits described above can be arbitrarily combined.

The content of the quantum dot (E) in the curable composition is normally 0.0001% by mass or more and 50% by mass or less in 100% by mass of the curable composition.

The content of the quantum dot (E) in the curable composition is preferably 0.0001% by mass or more and 5% by mass or less in 100% by mass of the curable composition, and is more preferably 0.0005% by mass or more and 2% by mass or less.

A composition in which the content of the quantum dot (E) is within the range described above is preferable in that the aggregation of the quantum dot (E) is less likely to occur and the light emitting properties are also demonstrated well.

[6] Antioxidant

The curable composition may comprise an antioxidant. As a result of this, a decrease in the quantum yield of a film formed by curing the curable composition due to heat can be suppressed.

The curable composition may comprise only one kind of antioxidant or may comprise two or more kinds thereof.

Examples of the antioxidant include, for example, amine based antioxidants, sulfur based antioxidants, phenol based antioxidants, phosphorus based antioxidants, metal compound based antioxidants, and the like. From the viewpoint of more effectively suppressing the decrease in the quantum yield due to heat described above, the antioxidant preferably comprises at least one kind selected from the group consisting of amine based antioxidants, sulfur based antioxidants, phenol based antioxidants, and phosphorus based antioxidants, and more preferably comprises at least one kind selected from the group consisting of sulfur based antioxidants, phenol based antioxidants, and phosphorus based antioxidants.

The amine based antioxidant is an antioxidant having an amino group in the molecule.

Examples of the amine based antioxidant include, for example, naphthylamine based antioxidants such as 1-naphthylamine, phenyl-1-naphthylamine, p-octylphenyl-1-naphthylamine, p-nonylphenyl-1-naphthylamine, p-dodecylphenyl-1-naphthylamine, and phenyl-2-naphthylamine; phenylenediamine based antioxidants such as N,N'-diisopropyl-p-phenylenediamine, N,N'-diisobutyl-p-phenylenediamine, N,N'-diphenyl-p-phenylenediamine, N,N'-di-β-naphthyl-p-phenylenediamine, N-phenyl-N'-isopropyl-p-phenylenediamine, N-cyclohexyl-N'-phenyl-p-phenylenediamine, N-1,3-dimethylbutyl-N'-phenyl-p-phenylenediamine, dioctyl-p-phenylenediamine, phenylhexyl-p-phenylenediamine, and phenyloctyl-p-phenylenediamine; diphenylamine based antioxidants such as dipyridylamine, diphenylamine, p,p'-di-n-butyldiphenylamine, p,p'-di-tert-butyldiphenylamine, p,p'-di-tert-pentyldiphenylamine, p,p'-dioctyldiphenylamine, p,p'-dinonyldiphenylamine, p,p'-didecyldiphenylamine, p,p'-didodecyldiphenylamine, p,p'-distyryldiphenylamine, p,p'-dimethoxydiphenylamine, 4,4'-bis(4-α,α-dimethylbenzoyl) diphenylamine, p-isopropoxydiphenylamine, dipyridylamine; phenothiazine based antioxidants such as phenothiazine, N-methylphenothiazine, N-ethylphenothiazine, 3,7-dioctylphenothiazine, phenothiazine carboxylic acid ester, and phenoselenazine; bis(2,2,6,6-tetramethyl-4-piperidinyl) sebacate (trade name "Tinuvin 770" manufactured by BASF SE); [(4-methoxyphenyl)-methylene]-bis(1,2,2,6,6-pentamethyl-4-piperidinyl) malonate (trade name "Hostavin PR31" manufactured by Clariant AG); and the like.

The sulfur based antioxidant is an antioxidant having a sulfur atom in the molecule.

Examples of the sulfur based antioxidant include, for example, dialkyl thiodipropionate compounds such as dilauryl, dimyristyl, or distearyl thiodipropionate ("SUMILIZER TPM" (trade name, manufactured by Sumitomo Chemical Co., Ltd.), and the like); β-alkylmercaptopropionic acid ester compounds of polyols such as tetrakis[methylene(3-dodecylthio)propionate]methane, tetrakis[methylene(3-laurylthio)propionate]methane; 2-mercaptobenzimidazole; and the like.

The phenol based antioxidant is an antioxidant having a phenolic hydroxy group in the molecule. In the present specification, a phosphorus-phenol based antioxidant that has both phenolic hydroxy group and phosphoric acid ester structure or phosphorous acid ester structure is classified as a phenol based antioxidant.

Examples of the phenol based antioxidant include, for example, 1,1,3-tris(2-methyl-4-hydroxy-5-tert-butylphenyl) butane, 4,4'-butylidenebis(3-methyl-6-tert-butylphenol), 1,3,5-trimethyl-2,4,6-tris(3,5-di-tert-butyl-4-hydroxybenzyl)benzene, 2-tert-butyl-6-(3-tert-butyl-2-hydroxy-5-methylbenzyl)-4-methylphenyl acrylate, (tetrakis[methylene-3-(3,5-di-tert-butyl-4-hydroxyphenyl)propionate]methane, pentaerythritol tetrakis[3-(3,5-di-tert-butyl-4-hydroxyphenyl)propionate], octadecyl 3-(3,5-di-tert-butyl-4-hydroxyphenyl)propionate ("Irganox 1076" (trade name, manufactured by BASF SE)), 3,3',3",5,5',5"-hexa-tert-butyl-a,a',a"-(mesitylen-2,4,6-triyl)tri-p-crezol, 1,3,5-tris(3,5-di-tert-butyl-4-hydroxybenzyl)-1,3,5-triazine-2,4,6(1H,3H,5H)-trione, 1,3,5-tris((4-tert-butyl-3-hydroxy-2,6-xylyl)methyl)-1,3,5-triazine-2,4,6(1H,3H,5H)-trione, thiodiethylenebis[3-(3,5-di-tert-butyl-4-hydroxyphenyl)propionate], benzenepropanoic acid, 3,5-bis(1,1-dimethylethyl)-4-hydroxy C7-C9 side chain alkyl ester, 4,6-bis(octylthiomethyl)-o-crezol, 2,4-bis(n-octylthio)-6-(4-hydroxy-3',5'-di-tert-butylanilino)-1,3,5-triazine, 3,9-bis(2-(3-(3-tert-butyl-4-hydroxy-5-methylphenyl)propionyloxy)-1,1-dimethylethyl)-2,4,8,10-tetraoxaspiro(5,5)undecane (manufactured by ADEKA CORPORATION, trade name "ADEKASTAB AO-80"), triethylene glycol bis[3-(3-tert-butyl-5-methyl-4-hydroxyphenyl)propionate], 4,4'-thiobis(6-tert-butyl-3-methylphenol), tris-(3,5-di-tert-butyl-4-hydroxybenzyl) isocyanurate, 1,3,5-tris(4-tert-butyl-3-hydroxy-2,6-dimethylbenzyl) isocyanurate, 1,6-hexanediol bis[3-(3,5-di-tert-butyl-4-hydroxyphenyl)propionate], N,N'-hexamethylenebis(3,5-di-tert-butyl-4-hydroxy-hydrocinnamamide), 1,3,5-trimethyl-2,4,6-tris(3,5-di-tert-butyl-4-hydroxybenzyl)benzene, 1,6-hexanediol bis-[3-(3,5-di-tert-butyl-4-hydroxyphenyl)propionate], 2,2'-methylenebis(4-methyl-6-tert-butylphenol), 1,3,5-tris(4-hydroxybenzyl) benzene, 6,6'-di-tert-butyl-4,4'-butylidenedi-m-cresol (manufactured by ADEKA CORPORATION, trade name "ADEKASTAB AO-40"), "Irganox 3125" (trade name, manufactured by BASF SE), "SUMILIZER BHT" (trade name, manufactured by Sumitomo Chemical Co., Ltd.), "SUMILIZER GA-80" (trade name, manufactured by Sumitomo Chemical Co., Ltd.), "SUMILIZER GS" (trade name, manufactured by Sumitomo Chemical Co., Ltd.), "Cyanox 1790" (trade name, manufactured by Cytec Industries Inc.), vitamin E (manufactured by Eisai Co., Ltd.), and the like.

Examples of the phosphorus-phenol based antioxidant include, for example, 2,10-dimethyl-4,8-di-tert-butyl-6-[3-(3,5-di-tert-butyl-4-hydroxyphenyl)propoxy]-12H-dibenzo[d,g][1,3,2]dioxaphosphocin, 2,4,8,10-tetra-tert-butyl-6-[3-(3,5-di-tert-butyl-4-hydroxyphenyl)propoxy]dibenzo[d,f][1,3,2]dioxaphosphepin, 2,4,8,10-tetra-tert-butyl-6-[3-(3,5-di-tert-butyl-4-hydroxyphenyl)propionyloxy]-dibenzo[d,f][1,3,2]dioxaphosphepin (manufactured by Sumitomo Chemical Co., Ltd., trade name "SUMILIZER GP"), and the like.

The phosphorus based antioxidant is an antioxidant having a phosphoric acid ester structure or phosphorous acid ester structure.

Examples of the phosphorus based antioxidant include, for example, diphenyl isooctyl phosphite, 2,2'-methylenebis(4,6-di-tert-butylphenyl)octyl phosphite, diphenyl isodecyl phosphite, diphenyl isodecyl phosphite, triphenyl phosphate, tributyl phosphate, diisodecyl pentaerythritol diphosphite, distearyl pentaerythritol diphosphite, cyclic neopentanetetrayl bis(2,4-di-tert-butylphenyl)phosphite, cyclic neopentanetetrayl bis(2,6-di-tert-butylphenyl)phosphite, cyclic neopentanetetrayl bis(2,6-di-tert-butyl-4-methylphenyl)phosphite, 6-[3-(3-tert-butyl-4-hydroxy-5-methylphenyl)propoxy]-2,4,8,10-tetra-tert-butylbenzo[d,f][1,3,2]dioxaphosphepin, tris(nonylphenyl) phosphite (manufactured by ADEKA CORPORATION, trade name "ADEKASTAB 1178"), tris(mono- & dinonylphenyl mixed) phosphite, diphenyl mono(tridecyl) phosphite, 2,2'-ethylidenebis(4,6-di-tert-butylphenol)fluorophosphite, phenyl diisodecyl phosphite, tris(2-ethylhexyl) phosphite, tris(isodecyl) phosphite, tris(tridecyl) phosphite, tris(2,4-di-tert-butylphenyl) phosphite, tetrakis(2,4-di-tert-butylphenyl)-4,4'-biphenylene-di-phosphonite, 4,4'-isopropylidene diphenyl tetraalkyl(C12-C15) diphosphite, 4,4'-butylidenebis(3-methyl-6-tert-butylphenyl)-ditridecyl phosphite, bis(nonylphenyl) pentaerythritol diphosphite, bis(2,4-di-tert-butylphenyl) pentaerythritol diphosphite, cyclic neopentanetetrayl bis(2,6-di-tert-butyl-4-methylphenyl-phosphite), 1,1,3-tris(2-methyl-4-ditridecyl phosphite-5-tert-butylphenyl)butane, tetrakis(2,4-di-tert-butyl-5-methylphenyl)-4,4'-biphenylene diphosphonite, tri-2-ethylhexyl phosphite, triisodecyl phosphite, tristearyl phosphite, phenyl diisodecyl phosphite, trilauryl trithiophosphite, distearylpentaerythritol diphosphite, tris(nonylphenyl) phosphite, tris[2-[[2,4,8,10-tetra-tert-butyldibenzo[d,f][1,3,2]dioxaphosphin-6-yl]oxy]ethyl] amine, bis(2,4-bis(1,1-dimethylethyl)-6-methylphenyl)ethyl ester phosphorous acid, 3,9-bis(2,6-di-tert-butyl-4-methylphenoxy)-2,4,8,10-tetraoxa-3,9-diphosphaspiro[5.5]undecane, bis(2,4-di-tert-butylphenyl)pentaerythritol diphosphite, 2,2'-methylenebis(4,6-di-tert-butyl-1-phenyloxy)(2-ethylhexyloxy)phosphorus, triphenyl phosphite, 4,4'-butylidene-bis(3-methyl-6-tert-butylphenylditridecyl)phosphite, octadecyl phosphite, 9,10-dihydro-9-oxa-10-phosphaphenanthrene 10-oxide, 10-(3,5-di-tert-butyl-4-hydroxybenzyl)-9,10-dihydro-9-oxa-10-phosphaphenanthrene 10-oxide, 10-decyloxy-9,10-dihydro-9-oxa-10-phosphaphenanthrene 10-oxide, 2,2-methylenebis(4,6-di-tert-butylphenyl)octyl phosphite, tetrakis(2,4-di-tertbutylphenyl) [1,1-biphenyl]-4,4'-diyl bisphosphonite, bis[2,4-bis(1,1-dimethylethyl)-6-methylphenyl]ethyl ester phosphonic acid, "ADEKASTAB 329K" (trade name, manufactured by ADEKA CORPORATION), "ADEKASTAB PEP36" (trade name, manufactured by ADEKA CORPORATION), "ADEKASTAB PEP-8" (trade name, manufactured by ADEKA CORPORATION), "Sandstab P-EPQ" (trade name, manufactured by Clariant AG), "Weston 618" (trade name, manufactured by GE Specialty Chemicals Inc.), "Weston 619G" (trade name, manufactured by GE Specialty Chemicals Inc.), "ULTRANOX 626" (trade name, manufactured by GE Specialty Chemicals Inc.), and the like.

The antioxidant comprising a phenol based antioxidant (which may be a phosphorus-phenol based antioxidant) is advantageous in improving the stability of the curable composition over time. When the curable composition comprises a phenol based antioxidant, the decrease in the quantum yield due to heat described above can be suppressed, and the effect of suppressing a decrease in the quantum yield of the curable composition over time can be enhanced as well.

The content of the antioxidant in the curable composition is, from the viewpoint of suppressing the decrease in the quantum yield due to heat described above and from the viewpoint of improving the stability of the curable composition over time, for example, 0.1% by mass or more and 20% by mass or less in 100% by mass of the solid content of the curable composition, preferably 0.2% by mass or more and 10% by mass or less, and more preferably 0.3% by mass or more and 5% by mass or less.

[7] Solvent

The curable composition can comprise a solvent from the viewpoint of the application properties of the curable composition, the dispersibility of the fluorescent particle (A) and/or the quantum dot (E), and the like.

Examples of the solvent include, for example, esters such as methyl formate, ethyl formate, propyl formate, pentyl formate, methyl acetate, ethyl acetate, and pentyl acetate; ketones such as γ-butyrolactone, N-methyl-2-pyrrolidone, acetone, dimethyl ketone, diisobutyl ketone, cyclopentanone, cyclohexanone, and methylcyclohexanone; ethers such as diethyl ether, methyl tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; glycol ethers such as ethylene glycol monomethyl ether, ethylene glycol monoethyl ether, ethylene glycol monobutyl ether, ethylene glycol monoethyl ether acetate, and triethylene glycol dimethyl ether; organic solvents having an amide group such as N,N-dimethylformamide, acetamide, and N,N-dimethylacetamide; organic solvents having a nitrile group such as acetonitrile, isobutyronitrile, propionitrile, and methoxyacetonitrile; organic solvents having a carbonate group such as ethylene carbonate and propylene carbonate; organic solvents having a halogenated hydrocarbon group such as methylene chloride and chloroform; organic solvents having a hydrocarbon group such as n-pentane, cyclohexane, n-hexane, benzene, toluene, and xylene; dimethyl sulfoxide; and the like.

Among the above, preferable are esters such as methyl formate, ethyl formate, propyl formate, pentyl formate, methyl acetate, ethyl acetate, and pentyl acetate; ketones such as γ-butyrolactone, N-methyl-2-pyrrolidone, acetone, dimethyl ketone, diisobutyl ketone, cyclopentanone, cyclohexanone, and methylcyclohexanone; ethers such as diethyl ether, methyl tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; organic solvents having a nitrile group such as acetonitrile, isobutyronitrile, propionitrile, and methoxyacetonitrile; organic solvents having a carbonate group such as ethylene carbonate and propylene carbonate; organic solvents having a halogenated hydrocarbon group such as methylene chloride and chloroform; and organic solvents having a hydrocarbon group such as n-pentane, cyclohexane, n-hexane, benzene, toluene, and xylene because they have low polarity and are thought to be unlikely to dissolve the fluorescent particle (A), and more preferable are organic solvents having a halogenated hydrocarbon group such as methylene chloride and chloroform; and organic solvents having a hydrocarbon group such as n-pentane, cyclohexane, n-hexane, benzene, toluene, and xylene.

When the curable composition comprises a solvent, the content thereof is not particularly limited, but for example, it is adjusted such that the solid content in the curable composition becomes 1% by mass or more and 99% by mass or less. The range described above is preferably 5% by mass or more and 95% by mass or less.

(8) Additional Components

The curable composition can further comprise additional components other than the above, if required. Examples of the additional components include, for example, resins (polymer compounds), leveling agents, light scattering agents (inorganic particles and the like), fillers, adhesion promoting agents, UV absorbers, anti-aggregation agents, curing agents, and the like.

The curable composition may comprise only one kind of additional component or may comprise two or more kinds thereof.

<Method for Producing Curable Composition>

(1) Method for Producing Perovskite Compound

The perovskite compound can be produced with reference to the known literatures (Nano Lett. 2015, 15, 3692-3696; ACS Nano, 2015, 9, 4533-4542), for example, by the method mentioned below.

(1-1) First embodiment of method for producing perovskite compound with A, B, and X as the components thereof A method for producing a perovskite compound according to the first embodiment includes the steps of:

dissolving a component B, a component X, and a component A in a solvent x to obtain a solution g; and mixing the obtained solution g with a solvent y, in which a perovskite compound has a lower solubility compared to that in the solvent x used in the step of obtaining the solution g.

More specifically, such a production method may be a production method including the steps of:

dissolving a compound comprising a component B and component X and a compound comprising a component A or a component A and component X in a solvent x to obtain a solution g; and mixing the obtained solution g with a solvent y, in which a perovskite compound has a lower solubility compared to that in the solvent x used in the step of obtaining the solution g.

Hereinafter, a production method will be described that includes the steps of: dissolving a compound comprising a component B and component X and a compound comprising a component A or a component A and component X in a solvent x to obtain a solution g; and mixing the obtained solution g with a solvent y, in which a perovskite compound has a lower solubility compared to that in the solvent x used in the step of obtaining the solution g.

Note that the solubility refers to the solubility at the temperature where the mixing step is performed.

Such a production method preferably includes a step of adding a capping ligand from the viewpoint of enabling stable dispersion of the perovskite compound. The capping ligand is preferably added before the mixing step mentioned above, and it may be added to the solution g in which the component A, component B, and component X have been dissolved, or it may be added to the solvent y, in which the perovskite compound has a lower solubility compared to that in the solvent x used in the step of obtaining the solution g, or may be added to both solvent x and solvent y.

The production method preferably includes a step of removing coarse particles by an approach such as centrifugation or filtration after the mixing step mentioned above. The size of the coarse particles to be removed by the removing step described above is preferably 10 μm or more, more preferably 1 μm or more, and further preferably 500 nm or more.

The step of mixing the solution g with the solvent y may be a step of:

(I) adding the solution g dropwise to the solvent y; or (II) adding the solvent y dropwise to the solution g.

However, from the viewpoint of enhancing the dispersibility of the fluorescent particle (A), (I) is preferable.

It is preferable to carry out stirring during the dropwise addition from the viewpoint of enhancing the dispersibility of the fluorescent particle (A).

In the step of mixing the solution g and the solvent y, there is no particular limitation on the temperature, but from the viewpoint of ensuring the ease of precipitation of the fluorescent particle (A), it is preferable to be in the range of −20° C. or higher and 40° C. or lower, and more preferable to be in the range of −5° C. or higher and 30° C. or lower.

Although the solvents x and y are not particularly limited, examples thereof include, for example, two kinds of solvents selected from the group consisting of alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; glycol ethers such as ethylene glycol monomethyl ether, ethylene glycol monoethyl ether, ethylene glycol monobutyl ether, ethylene glycol monoethyl ether acetate, and triethylene glycol dimethyl ether; organic solvents having an amide group such as N,N-dimethylformamide, acetamide, and N,N-dimethylacetamide; esters such as methyl formate, ethyl formate, propyl formate, pentyl formate, methyl acetate, ethyl acetate, and pentyl acetate; ketones such as γ-butyrolactone, N-methyl-2-pyrrolidone, acetone, dimethyl ketone, diisobutyl ketone, cyclopentanone, cyclohexanone, and methylcyclohexanone; ethers such as diethyl ether, methyl tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; organic solvents having a nitrile group such as acetonitrile, isobutyronitrile, propionitrile, and methoxyacetonitrile; organic solvents having a carbonate group such as ethylene carbonate and propylene carbonate; organic solvents having a halogenated hydrocarbon group such as methylene chloride and chloroform; and organic solvents having a hydrocarbon group such as n-pentane, cyclohexane, n-hexane, benzene, toluene, and xylene; and dimethyl sulfoxide.

As the solvent x used in the step of obtaining the solution g, a solvent in which the perovskite compound has a high solubility is preferable, and when that step is carried out at room temperature (10° C. to 30° C.) examples of the solvent x include, for example, alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; glycol ethers such as ethylene glycol monomethyl ether, ethylene glycol monoethyl ether, ethylene glycol monobutyl ether, ethylene glycol monoethyl ether acetate, and triethylene glycol dimethyl ether; organic solvents having an amide group such as N,N-dimethylformamide, acetamide, and N,N-dimethylacetamide; and dimethyl sulfoxide.

As the solvent y used in the mixing step, a solvent in which the perovskite compound has a low solubility is preferable, and when that step is carried out at room temperature (10° C. to 30° C.), examples of the solvent y include, for example, esters such as methyl formate, ethyl formate, propyl formate, pentyl formate, methyl acetate, ethyl acetate, and pentyl acetate; ketones such as γ-butyrolactone, N-methyl-2-pyrrolidone, acetone, dimethyl ketone, diisobutyl ketone, cyclopentanone, cyclohexanone, and methylcyclohexanone; ethers such as diethyl ether, methyl tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; organic solvents having a nitrile group such as acetonitrile, isobutyronitrile, propionitrile, and methoxyacetonitrile; organic solvents having a carbonate group such as ethylene carbonate and propylene carbonate; organic solvents having a halogenated hydrocarbon group such as methylene chloride and chloroform; and organic solvents having a hydrocarbon group such as n-pentane, cyclohexane, n-hexane, benzene, toluene, and xylene.

In the two kinds of solvents with different solubility, the difference in solubility is preferably 100 μg per 100 g of solvent or more and 90 g per 100 g of solvent or less, and is more preferably 1 mg per 100 g of solvent or more and 90 g per 100 g of solvent or less.

From the viewpoint of setting the difference in solubility to 100 μg per 100 g of solvent or more and 90 g per 100 g of solvent or less, when the mixing step is performed at room temperature (10° C. to 30° C.), for example, it is preferable that the solvent x should be an organic solvent having an amide group such as N,N-dimethylacetamide or dimethyl sulfoxide and the solvent y should be an organic solvent having a halogenated hydrocarbon group such as methylene chloride or chloroform; or an organic solvent having a hydrocarbon group such as n-pentane, cyclohexane, n-hexane, benzene, toluene, or xylene.

As a method for taking out the fluorescent particle (A) containing the perovskite compound from the obtained dispersion liquid containing the perovskite compound, mention may be made of a method in which solid-liquid separation is carried out, thereby recovering only the fluorescent particle (A).

Examples of the solid-liquid separation method mentioned above include a method of filtration and the like, a method of utilizing evaporation of the solvent, and the like.

(1-2) Second Embodiment of Method for Producing Perovskite Compound with a, B, and X as the Components Thereof A method for producing a perovskite compound according to the second embodiment is a production method including the steps of:

adding a component B, a component X, and a component A to a solvent z at high temperature to dissolve them, thereby obtaining a solution h; and cooling the obtained solution h.

More specifically, such a production method may be a production method including the steps of:

adding a compound comprising a component B and component X and a compound comprising a component A or a component A and component X to a solvent z at high temperature to dissolve them, thereby obtaining a solution h; and cooling the obtained solution h.

The step of obtaining a solution h may be a step in which, after adding a compound comprising a component B and component X and a compound comprising a component A or a component A and component X to a solvent z, the temperature is raised, thereby obtaining a solution h.

In such a production method, the fluorescent particle (A) containing the perovskite compound can be precipitated by the difference in solubility due to the difference in temperature.

Such a production method preferably includes a step of adding a capping ligand from the viewpoint of enabling stable dispersion of the perovskite compound. The capping ligand is preferably contained in the solution h before the cooling step mentioned above.

The production method preferably includes a step of removing coarse particles by an approach such as centrifugation or filtration after the cooling step. The size of the coarse particles to be removed by the removing step described above is preferably 10 µm or more, more preferably 1 µm or more, and further preferably 500 nm or more.

The solvent z at high temperature is any solvent as long as it is a solvent at a temperature where the compound comprising the component B and component X and the compound comprising the component A or the component A and component X are dissolved, and for example, a solvent with a boiling point of 60° C. or higher and 600° C. or lower is preferable, and a solvent with a boiling point of 80° C. or higher and 400° C. or lower is more preferable.

The cooling temperature is preferably −20° C. or higher and 50° C. or lower, and is more preferably −10° C. or higher and 30° C. or lower.

Although the solvent z is not particularly limited as long as it is a solvent that can dissolve the compound comprising the component B and component X and the compound comprising the component A or the component A and component X, examples thereof include, for example, esters such as methyl formate, ethyl formate, propyl formate, pentyl formate, methyl acetate, ethyl acetate, and pentyl acetate; ketones such as γ-butyrolactone, N-methyl-2-pyrrolidone, acetone, dimethyl ketone, diisobutyl ketone, cyclopentanone, cyclohexanone, and methylcyclohexanone; ethers such as diethyl ether, methyl tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole; alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; glycol ethers such as ethylene glycol monomethyl ether, ethylene glycol monoethyl ether, ethylene glycol monobutyl ether, ethylene glycol monoethyl ether acetate, and triethylene glycol dimethyl ether; organic solvents having an amide group such as N,N-dimethylformamide, acetamide, and N,N-dimethylacetamide; organic solvents having a nitrile group such as acetonitrile, isobutyronitrile, propionitrile, and methoxyacetonitrile; organic solvents having a carbonate group such as ethylene carbonate and propylene carbonate; organic solvents having a halogenated hydrocarbon group such as methylene chloride and chloroform; organic solvents having a hydrocarbon group such as n-pentane, cyclohexane, n-hexane, benzene, toluene, and xylene; dimethyl sulfoxide; and 1-octadecene.

As a method for taking out the fluorescent particle (A) containing the perovskite compound from the obtained dispersion liquid containing the perovskite compound, mention may be made of a method in which solid-liquid separation is carried out, thereby recovering only the fluorescent particle (A).

Examples of the solid-liquid separation method mentioned above include a method of filtration and the like, a method of utilizing evaporation of the solvent, and the like.

(2) Method for Producing Curable Composition

The curable composition can be prepared by mixing the fluorescent particle (A), the photopolymerizable compound (B), and the dispersing agent (C), as well as the photopolymerization initiator (D), quantum dot (E), antioxidant, solvent, and additional components, to be used as required.

<Film>

A film can be obtained by using the curable composition described above.

For example, a film can be formed by applying the curable composition to a substrate using a publicly known method such as a gravure coater, a dip coater, a reverse coater, a wire bar coater, a die coater, or an inkjet method, and subjecting the substrate to a curing process by photoirradiation.

There is no particular limitation on the light to be used for the curing treatment, and light such as ultraviolet light and visible light can be used. Light with a wavelength of 150 to 800 nm is preferable, and light with a wavelength of 200 to 500 nm is more preferable.

As the light source, a low pressure mercury lamp, a high pressure mercury lamp, an ultra high pressure mercury lamp, a chemical lamp, a light emitting diode (LED) light source, an excimer laser generator, and the like can be used, and active light rays having a wavelength of 300 nm or more and 450 nm or less such as the i-line (365 nm), the h-line (405 nm), and the g-line (436 nm) can be preferably used. Also, if required, the irradiated light may be adjusted through a spectral filter such as a long wavelength cut filter, a short wavelength cut filter, or a band pass filter.

The amount of exposure is preferably 1 mJ/cm$^2$ or more and 5000 mJ/cm$^2$ or less, more preferably 10 mJ/cm$^2$ or more and 2000 mJ/cm$^2$ or less, and further preferably 30 mJ/cm$^2$ or more and 500 mJ/cm$^2$ or less.

The film shape is not particularly limited, and can be any shape such as sheet shape or bar shape.

The thickness of the film may be 0.01 µm or more and 1000 mm or less, may be 0.1 µm or more and 10 mm or less, and may be 1 µm or more and 1 mm or less.

The film may be a single layer or multiple layers. In the case of multiple layers, the same kind of curable composition may be used for each layer, or different kinds of curable compositions may be used for each other.

<Laminated Body>

A laminated body according to the present invention has a plurality of layers, and at least one layer is the film mentioned above.

Out of the plurality of layers that the laminated body has, as the layers other than the film mentioned above, mention may be made of any layer such as a substrate, a barrier layer, and a light scattering layer.

The shape of films to be laminated is not particularly limited, and can be any shape such as sheet shape or bar shape.

(1) Substrate

Although there is no particular limitation on the substrate, it may be a film, and from the viewpoint of extracting the emitted light, the substrate preferably has translucency, and is more preferably transparent. As the material of the substrate, for example, a publicly known material such as a thermoplastic resin including polyethylene terephthalate or glass can be used.

For example, in the laminated body, the film mentioned above may be provided on the substrate.

FIG. 1 is a schematic sectional view illustrating one example of the configuration of a laminated body. In a laminated body 1a illustrated in FIG. 1, a film 10 composed of a cured product of the curable composition is provided between substrates 20 and 21. The film 10 may be sealed by a sealing material.

(2) Barrier Layer

The laminated body may comprise a barrier layer from the viewpoint of protecting the film formed from the curable composition from water vapor in the outside air and air in the atmosphere.

Although there is no particular limitation on the barrier layer, from the viewpoint of extracting the emitted light, it preferably has translucency, and is more preferably transparent. As the material of the barrier layer, for example, a publicly known material such as a thermoplastic resin including polyethylene terephthalate or glass can be used.

(3) Light Scattering Layer

The laminated body may comprise a light scattering layer from the viewpoint of effectively utilizing the incident light.

Although there is no particular limitation on the light scattering layer, from the viewpoint of extracting the emitted light, it preferably has translucency, and is more preferably transparent.

As the light scattering layer, a publicly known light scattering layer such as a layer containing a light scattering agent (light scattering particles) including silica particles or an amplification diffusion film can be used.

<Light Emitting Apparatus>

A light emitting apparatus according to the present invention comprises the film described above or the laminated body described above, and normally, in addition to this, further comprises a light source. The light emitting apparatus is an apparatus for extracting light by irradiating the film or laminated body, which is installed in the subsequent stage, with light emitted from the light source to make the film or laminated body emit light. The light emitting apparatus can be further equipped with any layer such as a light reflective member, a brightness enhancement section, a prism sheet, a light guide plate, and a medium material layer between elements.

(1) Light Source

Although there is no particular limitation on the light source, a light source having an emission wavelength of 600 nm or less is preferable from the viewpoint of causing the fluorescent particle (A) in the film or laminated body to emit light. As the light source, for example, a publicly known light source such as a light emitting diode (LED) including a blue light emitting diode, a laser, and an EL can be used.

(2) Light Reflective Member

The light emitting apparatus may comprise a light reflective member (70 in FIG. 2) from the viewpoint of directing light from the light source towards the film or laminated body. Although there is no particular limitation on the light reflective member, it may be a reflective film.

As the reflective film, for example, a publicly known reflective film such as a reflective mirror, a film of reflective particles, a reflective metal film, or a reflective body can be used.

(3) Brightness Enhancement Section

The light emitting apparatus may comprise a brightness enhancement section from the viewpoint of reflecting a part of the light back towards the direction in which the light was transmitted.

(4) Prism Sheet

The light emitting apparatus may have a prism sheet. The prism sheet typically has a base material section and a prism section. The base material section may be omitted, depending on the adjacent members.

The prism sheet can be pasted together with the adjacent members via any appropriate adhesive layer (for example, an adhesive layer or a sticker layer). The prism sheet is configured to have a plurality of unit prisms that are convex in parallel on the side opposite to the visible side (rear side). By arranging the convex sections of the prism sheet toward the rear side, the light that passes through the prism sheet is more likely to be focused. Also, when the convex sections of the prism sheet are arranged toward the rear side, there is less light reflected without incident on the prism sheet compared to the case where the convex sections are arranged toward the visible side, and a display apparatus with high brightness can be obtained.

(5) Light Guide Plate

The light emitting apparatus may have a light guide plate. As the light guide plate, for example, any appropriate light guide plate such as a light guide plate having a lens pattern formed on the rear side such that light from the lateral direction can be deflected in the thickness direction or a light guide plate having a prism shape or the like formed on the rear side and/or the visible side can be used.

(6) Medium Material Layer Between Elements

The light emitting apparatus may have a layer composed of one or more medium materials (medium material layer between elements) provided on the light path between the adjacent elements (layers).

Although there is no particular limitation on the one or more mediums contained in the medium material layer between the elements, examples thereof include vacuum, air, gas, optical materials, adhesives, optical adhesives, glass, polymers, solids, liquids, gels, cured materials, optical bonding materials, refractive index matching or refractive index mismatching materials, refractive index gradient materials, cladding or anti-cladding materials, spacers, silica gel, brightness enhancement materials, scattering or diffusion materials, reflective or anti-reflective materials, wavelength selective materials, wavelength selective anti-reflective materials, color filters, suitable mediums known in the art, and the like.

Specific examples of the display apparatus according to the present invention include, for example, those equipped with a wavelength conversion material for EL display apparatuses and liquid crystal display apparatuses.

Specific examples thereof include the followings:

(E1) a backlight that converts blue light into green light or red light, in which a cured product (cured film) composed of the curable composition according to the present invention is placed in a glass tube or the like and sealed, and this is arranged between a blue light emitting diode, which is a light source, and a light guide plate, along an end face (side face) of the light guide plate (on-edge type backlight);

(E2) a backlight in which a laminated film formed by sandwiching and sealing a cured product sheet of the curable composition according to the present invention between two barrier films is installed on a light guide plate whereby blue light irradiated from a blue light emitting diode placed on an end face (side face) of the light guide plate through the light guide plate onto the sheet is converted to green light or red light (surface mounted type backlight);

(E3) a backlight in which the curable composition according to the present invention is dispersed in a resin or the like and installed in the vicinity of a light emitting section of a blue light emitting diode whereby irradiated blue light is converted into green light or red light (on-chip type backlight); and (E4) a backlight in which the curable composition according to the present invention is dispersed in a resist and installed on a color filter whereby blue light irradiated from a light source is converted into green light or red light.

Other specific examples of the display apparatus include a lighting in which the curable composition according to the present invention is cured and shaped and arranged in the subsequent stage of a blue light emitting diode, which is a light source, whereby blue light is converted into green light or red light, thereby emitting white light.

<Display Apparatus>

As illustrated in FIG. 2, a display apparatus 3, which is one embodiment of the present invention, comprises a liquid crystal panel 40 and the light emitting apparatus mentioned above, in this order from the visible side.

The light emitting apparatus comprises a laminated body 1b and a light source 30. The laminated body 1b further comprises, in addition to the laminated body 1a mentioned above, a prism sheet 50 and a light guide plate 60. The display apparatus may further comprise any appropriate additional members.

(1) Liquid Crystal Panel

The liquid crystal panel described above typically comprises a liquid crystal cell, a visible side polarizing plate arranged on the visible side of the liquid crystal cell, and a rear side polarizing plate arranged on the rear side of the liquid crystal cell. The visible side polarizing plate and the rear side polarizing plate can be arranged such that their respective absorption axes are substantially orthogonal or parallel.

(2) Liquid Crystal Cell

The liquid crystal cell has a pair of substrates and a liquid crystal layer as a display medium sandwiched between those substrates. In a general configuration, a color filter and a black matrix are provided on one substrate, and on the other substrate, a switching element that controls the electrooptic characteristics of the liquid crystal, a scanning line that provides a gate signal and a signal line that provides a source signal to the switching element, a pixel electrode, and a counter electrode are provided. The gap between the substrates described above (cell gap) can be controlled by a spacer or the like. On the side of the above substrate in contact with the liquid crystal layer, for example, an oriented film composed of a polyimide can be provided.

(3) Polarizing Plate

The polarizing plate typically has a polarizer and a protective layer arranged on one side or both sides of the polarizer. The polarizer is typically an absorption type polarizer.

As the polarizer described above, any appropriate polarizer is used. Examples thereof include, for example, those obtained by adsorbing a dichroic substance such as iodine or dichroic dye onto a hydrophilic polymer film such as polyvinyl alcohol based film, partially formalized polyvinyl alcohol based film, or ethylene-vinyl acetate copolymer based partially saponified film, which is then subjected to uniaxial stretching; polyene based oriented films such as dehydrated products of polyvinyl alcohol or dehydrochlorinated products of polyvinyl chloride; and the like. Among the above, polarizers obtained by adsorbing a dichroic substance such as iodine onto a polyvinyl alcohol based film, which is then subjected to uniaxial stretching, are particularly preferable because of their high dichroic ratio of polarized light.

<LED>

As one example of the application of the curable composition according to the present invention, mention may be made of, for example, a wavelength conversion material for light emitting diodes (LEDs).

The curable composition according to the present invention can be used as, for example, a material for the light emitting layer of LEDs.

Examples of the LED comprising the curable composition according to the present invention include, for example, one having a structure in which a mixture of the curable composition according to the present invention and electrically conductive particles such as ZnS is layered in the form of a film, with a n-type transport layer laminated on one side and a p-type transport layer laminated on the other side, and operating under a scheme in which an electric current is applied, the holes of the p-type semiconductor and the electrons of the n-type semiconductor cancel out the electric charges at the joint surface, thereby emitting light.

<Solar Battery>

The curable composition according to the present invention can be utilized as an electron transport material contained in the active layer of solar batteries.

Although the configuration is not particularly limited, examples of the solar battery include, for example, a solar battery having a fluorine doped tin oxide (FTO) substrate, a titanium oxide compact layer, a porous aluminum oxide layer, an active layer containing the curable composition according to the present invention, a hole transport layer such as 2,2',7,7'-tetrakis(N,N-di-p-methoxyphenylamine)-9, 9-spirobifluorene (Spiro-MeOTAD), and a silver (Ag) electrode, in this order.

The titanium oxide compact layer has functions of electron transport, reducing the roughness of FTO, and suppressing the reverse electron transfer.

The porous aluminum oxide layer has a function of improving the light absorption efficiency.

The curable composition according to the present invention, contained in the active layer, has functions of charge separation and electron transport.

<Method for Producing Laminated Body>

The method for producing a laminated body may be as follows:

(i) a method including the steps of: coating a substrate with the curable composition according to the present invention; removing a solvent; and curing the layer of the coated curable composition;

(ii) a method including the steps of: coating a substrate with the curable composition according to the present invention; and curing the layer of the coated curable composition; or (iii) a method including the step of pasting a film formed by curing the curable composition according to the present invention together with a substrate.

Although there is no particular limitation on the step of coating a substrate included in the production methods of (i) and (ii), a publicly known coating method such as a gravure coating method, a bar coating method, a printing method, a spray method, a spin coating method, a dip method, and a die coat method can be used.

In the step of pasting a film together with a substrate included in the production method of (iii), any adhesive can be used.

The adhesive is not particularly limited as long as it does not dissolve the fluorescent particle (A), and publicly known adhesives can be used.

The method for producing a laminated body may include the step of further pasting the laminated body obtained in (i) to (iii) together with any film or layer.

Examples of the optional film to be pasted together include, for example, reflective films and diffusion films.

In the step of pasting the film together, any adhesive can be used.

EXAMPLES

Hereinafter, the present invention will be described further specifically with reference to Examples, but the present invention is not limited by these examples. In the examples, the percentages and parts representing the content or the amount to be used are on a mass basis, unless otherwise specified.

Production Example 1: Preparation of Fluorescent Particle (A) [Particle 1] Containing Perovskite Compound After mixing 25 mL of oleylamine and 200 mL of ethanol, 17.12 mL of an aqueous hydrobromic acid solution (48% by mass) was added with ice cooling and stirring, and then the precipitation was obtained by drying under reduced pressure. The precipitation was washed with diethyl ether and was then dried under reduced pressure, thereby obtaining oleylammonium bromide. Into 21 g of the obtained oleylammonium bromide, 200 mL of toluene was mixed, thereby preparing a solution containing oleylammonium bromide.

1.52 g of lead acetate trihydrate, 1.56 g of formamidine acetate, 160 mL of 1-octadecene as a solvent, and 40 mL of oleic acid were mixed. After stirring and heating the mixture to 130° C. with nitrogen flowing, 53.4 mL of the solution containing oleylammonium bromide mentioned above was added thereto. After the addition, the temperature of the solution was lowered to room temperature to obtain a dispersion liquid 1 containing a fluorescent particle 1.

A solution obtained by mixing 100 mL of toluene and 50 mL of acetonitrile into 200 mL of the dispersion liquid 1 described above was subjected to solid-liquid separation by filtration. Thereafter, the solids on the filtration were washed with a mixed solution of 100 mL of toluene and 50 mL of acetonitrile twice and then filtered. As a result of this, the fluorescent particle 1 was obtained.

The obtained fluorescent particle 1 was dispersed with toluene to obtain a dispersion liquid 2.

When the dispersion liquid 2 was subjected to an XRD measurement, the XRD spectrum had a peak derived from (hkl)=(001) at the position of $2\theta=14.75°$. From the measurement results, it was confirmed that the recovered fluorescent particle 1 is a compound having a three dimensional perovskite type crystal structure.

For the XRD measurement of the dispersion liquid 2, XRD, CuKα radiation, X'pert PRO MPD, manufactured by Spectris Co., Ltd. was used.

After dissolving the perovskite compound by adding N,N-dimethylformamide to a part of the dispersion liquid 2 described above, the fluorescent particle (A) composed of the perovskite compound was measured using ICP-MS (manufactured by PerkinElmer Co., Ltd., ELAN DRC II) and ion chromatograph (manufactured by Thermo Fisher Scientific K.K., Integrion) and found out to be 1500 ppm (µg/g).

Production Example 2: Preparation of Fluorescent Particle (A) [Particle 2] Containing Perovskite Compound Into 200 mL of the dispersion liquid 2 described above, toluene was mixed such that the concentration of the fluorescent particle 1 became 0.23% by mass. To this, 1.9 parts by mass of organopolysilazane (1500 Slow Cure, Durazane, manufactured by Merck Performance Materials Ltd.) was added per 1 part by mass of the fluorescent particle 1 in the dispersion liquid 2. Subsequently, a modification treatment with water vapor was performed for 4 hours to obtain a dispersion liquid 3 containing the fluorescent particle 2.

The modification treatment conditions at that time were set as follows: the flow rate of water vapor was 0.2 L/min (supplied together with $N_2$ gas, saturated water vapor volume at 30° C.) and the heating temperature was 80° C. The obtained fluorescent particle (A) exhibited emission of green light.

Example 1: Preparation of Curable Composition

A curable composition was prepared by mixing the dispersion liquid 2 containing the fluorescent particle 1 composed of the perovskite compound obtained in Production Example 1 and other compounding components shown in Table 1, and then removing toluene with an evaporator. The compounding ratio of each compounding component was adjusted such that the amount to be compounded for each compounding component is the amount shown in Table 1 when the content of the fluorescent particle in the curable composition is 1.0 parts by mass. In Table 1, the unit of the amount to be compounded for each compounding component is in parts by mass.

Comparative Example 1: Preparation of Curable Composition

Preparation of a curable composition was carried out in the same manner as in Example 1, except that no dispersing agent was added and that the amount to be used for the photopolymerizable compound (B) was changed to the amount described in Table 1.

Examples 2 to 7: Preparation of Curable Compositions

Preparation of curable compositions was carried out in the same manner as in Example 1, except that the dispersion liquid 3 containing the fluorescent particle 2 was used and that other compounding components shown in Table 1 were mixed in in an amount described in Table 1.

Example 8: Preparation of Curable Composition

A curable composition was prepared by mixing the dispersion liquid 2 containing the fluorescent particle 1 composed of the perovskite compound obtained in Production Example 1 and other compounding components shown in Table 2, and then removing toluene with an evaporator. The compounding ratio of each compounding component was adjusted such that the amount to be compounded for each compounding component is the amount shown in Table 2 when the content of the fluorescent particle in the curable composition is 1.0 parts by mass. In Table 2, the unit of the amount to be compounded for each compounding component is in parts by mass.

Comparative Example 2: Preparation of Curable Composition

Preparation of a curable composition was carried out in the same manner as in Example 8, except that no dispersing agent was added and that the amount to be used for the photopolymerizable compound (B) was changed to the amount described in Table 2.

Examples 9 to 14: Preparation of Curable Compositions

Preparation of curable compositions was carried out in the same manner as in Example 8, except that the dispersion liquid 3 containing the fluorescent particle 2 was used and that other compounding components shown in Table 2 were mixed in in an amount described in Table 2.

The details of each compounding component shown in Table 1 and Table 2 are as follows:

[a] Photopolymerizable compound (B): dipentaerythritol hexaacrylate (manufactured by SHIN-NAKAMURA CHEMICAL CO., LTD.);
[b] Dispersing agent 1: a phosphoric acid compound based dispersing agent (resin type dispersing agent manufactured by BYK Japan KK., trade name "DISPERBYK-118");
[c] Dispersing agent 2: a carboxylic acid compound based dispersing agent (methoxypolyethylene glycol 5,000 propionic acid manufactured by Sigma-Aldrich Co. LLC.);
[d] Dispersing agent 3: an acrylic dispersing agent having a tertiary amine (resin type dispersing agent manufactured by BYK Japan KK., trade name "BYK-LPN6919", see International Publication No. WO 2016/158672 and International Publication No. WO 2013/084932);
[e] Dispersing agent 4: an acrylic dispersing agent having a tertiary amine and a quaternary ammonium salt (resin type dispersing agent manufactured by BYK Japan KK., trade name "BYK-LPN21116", see International Publication No. WO 2016/158672 and International Publication No. WO 2013/084932);
[f] Dispersing agent 5: a thiol based dispersing agent (dispersing agent manufactured by YUKA SANGYO CO., LTD., trade name "SUNBRIGHT ME-050SH");
[g] Quantum dot: an InP/ZnS core-shell type quantum dot that exhibits emission of red light (quantum dot that can be synthesized by a commonly known method (Journal of American Chemical Society. 2007, 129, 15432-15433) disclosed in Japanese Patent Laid-Open No. 2016-65178); and
[h] Photopolymerization initiator: "omnirad 819" (phenylbis(2,4,6-trimethylbenzoyl)phosphine oxide) manufactured by IGM Resins B.V.

[Evaluation Test]
[1] Dispersibility of Fluorescent Particle (A) to Photopolymerizable Compound (B)

While irradiating the curable composition placed in a flask with white light, the state of the curable composition was visually observed and evaluated based on the following criteria. The results are shown in Table 1. The presence of a bright spot means the presence of an aggregate of the fluorescent particle (A).

A: No bright spot is recognized.
B: A bright spot is recognized.

(2) Quantum Yield of Curable Composition

The quantum yield (%) was measured by casting the dispersion liquid containing the fluorescent material to be used for the curable composition onto a glass substrate to form an applied layer and using an absolute PL quantum yield spectrometer (manufactured by Hamamatsu Photonics K.K., C9920-02) at an excitation light of 450 nm, at room temperature, and under the atmosphere. This quantum yield is defined as QY0 (%). As the dispersion liquid described above, the dispersion liquid 2 was used for Example 1 and Comparative Example 1, the dispersion liquid 3 was used for Examples 2 to 6, and a dispersion liquid formed by adding a quantum dot to the dispersion liquid 3 at the same mass ratio as the fluorescent particle was used for Example 7.

Also, the quantum yield (%) was measured by casting the curable composition onto a glass substrate to form an applied layer and using an absolute PL quantum yield spectrometer (manufactured by Hamamatsu Photonics K.K., C9920-02) at an excitation light of 450 nm, at room temperature, and under the atmosphere. This quantum yield is defined as QY1 (%).

Based on the measurement results, "QY1/QY0" was calculated. The results are shown in Table 1. The numerical value described in the column of "QY1/QY0" in Table 1 is expressed as a percentage (that is, 100×QY1/QY0 (%)).

[3] Quantum Yield of Cured Film

The curable composition was cast onto a glass substrate to form an applied layer, and the applied layer was cured by irradiating the applied layer with ultraviolet light (UVA) from a high pressure mercury lamp. The thickness of the cured film thus obtained was 100 μm. The irradiation conditions of ultraviolet light are as follows.

Examples 8 to 14 and Comparative Example 2: the accumulated amount of light was 200 mJ/cm$^2$ and the exposure atmosphere was air.

As for the laminated body composed of the glass substrate and the cured film of the curable composition formed thereon obtained as described above, the quantum yield (%) was measured in the same manner as described above. This quantum yield is defined as QY2 (%).

Based on the measurement results, "QY2/QY0" was calculated. The results are shown in Table 2. The numerical value described in the column of "QY2/QY0" in Table 2 is expressed as a percentage (that is, 100×QY2/QY0 (%)). As for the QY0 values of Examples 8 to 14 and Comparative Example 2, the QY0 values of Examples 1 to 7 and Comparative Example 1 were used, respectively.

TABLE 1

| | | Example 1 | Example 2 | Example 3 | Example 4 | Example 5 | Example 6 | Example 7 | Comparative Example 1 |
|---|---|---|---|---|---|---|---|---|---|
| Fluorescent particle (A) | Fluorescent particle 1 | 1.0 | | | | | | | 1.0 |
| | Fluorescent particle 2 | | 1.0 | 1.0 | 1.0 | 1.0 | 1.0 | 1.0 | |
| Photopolymerizable compound (B) | | 98.0 | 98.0 | 98.0 | 98.0 | 98.0 | 98.0 | 96.0 | 99.0 |
| Dispersing agent (C) | Dispersing agent 1 | | 1.0 | | | | | | |
| | Dispersing agent 2 | | | 1.0 | | | | | |
| | Dispersing agent 3 | | | | 1.0 | | | | |
| | Dispersing agent 4 | 1.0 | | | | 1.0 | | 1.0 | |
| | Dispersing agent 5 | | | | | | 1.0 | 1.0 | |
| Quantum dot | | | | | | | | 1.0 | |
| Evaluation results | Dispersibility | A | A | A | A | A | A | A | B |
| | QY1/QY0 | 68 | 84 | 85 | 85 | 79 | 43 | 77 | 40 |

TABLE 2

| | | Example 8 | Example 9 | Example 10 | Example 11 | Example 12 | Example 13 | Example 14 | Comparative Example 2 |
|---|---|---|---|---|---|---|---|---|---|
| Fluorescent particle (A) | Fluorescent particle 1 | 1.0 | | | | | | | 1.0 |
| | Fluorescent particle 2 | | 1.0 | 1.0 | 1.0 | 1.0 | 1.0 | 1.0 | |
| Photopolymerizable compound (B) | | 97.0 | 97.0 | 97.0 | 97.0 | 97.0 | 97.0 | 95.0 | 98.0 |
| Dispersing agent (C) | Dispersing agent 1 | | 1.0 | | | | | | |
| | Dispersing agent 2 | | | 1.0 | | | | | |
| | Dispersing agent 3 | | | | 1.0 | | | | |
| | Dispersing agent 4 | 1.0 | | | | 1.0 | | 1.0 | |
| | Dispersing agent 5 | | | | | | 1.0 | 1.0 | |
| Quantum dot | | | | | | | | 1.0 | |
| Photopolymerization initiator | | 1.0 | 1.0 | 1.0 | 1.0 | 1.0 | 1.0 | 1.0 | 1.0 |
| Evaluation results | QY2/QY0 | 35 | 44 | 45 | 45 | 42 | 23 | 52 | 21 |

REFERENCE SIGNS LIST 1a, 1b Laminated body
10 Film
20, 21 Substrate
3 Display apparatus
30 Light source
40 Liquid crystal panel
50 Prism sheet
60 Light guide plate
70 Light reflective member

The invention claimed is:

1. A curable composition comprising a fluorescent particle (A) containing a perovskite compound, a photopolymerizable compound (B), and a dispersing agent (C),
  wherein the dispersing agent (C) is present in the curing composition in an amount of 0.1 to 20 parts by mass relative to 1 part by mass of the fluorescent particle, and the dispersing agent (C) includes at least one kind of compound selected from the group consisting of phosphoric acid compounds, carboxylic acid compounds, and tertiary amine compounds,
  the compound selected from the group consisting of phosphoric acid compounds, carboxylic acid compounds, and tertiary amine compounds contains at least one bond selected from the group consisting of an ether bond and an ester bond in a molecular chain,
  the tertiary amine compounds do not contain a quaternary ammonium group, and
  the curable composition possesses a QY maintenance rate (%) of 80% or more.

2. The curable composition according to claim 1, further comprising a quantum dot.

3. The curable composition according to claim 1, wherein:
  the dispersing agent (C) is present in the curing composition in an amount of 0.1 to 1 parts by mass relative to 1 part by mass of the fluorescent particle.

4. A film formed by curing the curable composition according to claim 1.

5. A laminated body comprising the film according to claim 4 and a layer other than the film.

6. A display apparatus comprising the laminated body according to claim 5.

7. A curable composition comprising a fluorescent particle (A) containing a perovskite compound, a photopolymerizable compound (B), and a dispersing agent (C),
- wherein the dispersing agent (C) is present in the curing composition in an amount of 0.1 to 20 parts by mass relative to 1 part by mass of the fluorescent particle, and the dispersing agent (C) includes at least one kind of compound selected from the group consisting of phosphoric acid compounds, carboxylic acid compounds, and tertiary amine compounds,
- the compound selected from the group consisting of phosphoric acid compounds, carboxylic acid compounds, and tertiary amine compounds contains at least one bond selected from the group consisting of an ether bond and an ester bond in a molecular chain,
- the tertiary amine compounds do not contain a quaternary ammonium group, and
- the curable composition possesses a QY maintenance rate (%) of 80% or more, and
- wherein the photopolymerizable compound (B) includes a (meth)acrylic compound having three or more (meth)acryloyloxy groups in the molecule.

8. The curable composition according to claim 7, wherein:
the dispersing agent (C) is present in the curing composition in an amount of 0.1 to 1 parts by mass relative to 1 part by mass of the fluorescent particle.

* * * * *